United States Patent
Uto et al.

(10) Patent No.: US 11,158,748 B2
(45) Date of Patent: Oct. 26, 2021

(54) SOLAR CELL, SOLAR CELL MODULE, AND SOLAR CELL MANUFACTURING METHOD

(71) Applicant: KANEKA CORPORATION, Osaka (JP)

(72) Inventors: Toshihiko Uto, Osaka (JP); Daisuke Adachi, Osaka (JP)

(73) Assignee: KANEKA CORPORATION, Osaka (JP)

(*) Notice: Subject to any disclaimer, the term of this patent is extended or adjusted under 35 U.S.C. 154(b) by 53 days.

(21) Appl. No.: 16/585,038

(22) Filed: Sep. 27, 2019

(65) Prior Publication Data

US 2020/0028003 A1    Jan. 23, 2020

Related U.S. Application Data

(63) Continuation of application No. PCT/JP2017/047092, filed on Dec. 27, 2017.

(30) Foreign Application Priority Data

Mar. 31, 2017   (JP) .............................. JP2017-071905

(51) Int. Cl.
*H01L 31/0236*    (2006.01)
*H01L 31/0747*    (2012.01)
*H01L 31/0224*    (2006.01)
*H01L 31/20*      (2006.01)

(52) U.S. Cl.
CPC .... *H01L 31/02363* (2013.01); *H01L 31/0747* (2013.01); *H01L 31/202* (2013.01); *H01L 31/022441* (2013.01)

(58) Field of Classification Search
CPC ........... H01L 31/02363; H01L 31/0547; H01L 31/0747; H01L 31/068; H01L 31/0682; H01L 31/022441; H01L 31/0236
USPC ........................................................ 136/256
See application file for complete search history.

(56) References Cited

U.S. PATENT DOCUMENTS

| 2009/0223561 A1 | 9/2009 | Kim et al. |
| 2011/0088767 A1 | 4/2011 | Lin et al. |
| 2011/0272012 A1* | 11/2011 | Heng ................. H01L 31/0747 |
| | | 136/255 |

(Continued)

FOREIGN PATENT DOCUMENTS

| JP | 2003-142708 A | 5/2003 |
| JP | 2011086902 A | 4/2011 |

(Continued)

OTHER PUBLICATIONS

International Search Report issued in corresponding International Application No. PCT/JP2017/047092; dated Apr. 10, 2018 (2 pages).

(Continued)

*Primary Examiner* — Andrew J Golden
(74) *Attorney, Agent, or Firm* — Osha Bergman Watanabe & Burton LLP

(57) ABSTRACT

A solar cell includes a crystal substrate which has a major surface on a light reception side provided with a first texture surface and a major surface on a non-light reception side provided with a second texture surface. The second texture surface occupies 20% or more of the area of the major surface on the non-light reception side.

9 Claims, 16 Drawing Sheets

(56) References Cited

U.S. PATENT DOCUMENTS

| | | | |
|---|---|---|---|
| 2012/0211066 A1* | 8/2012 | Yamazaki | H01L 31/068 |
| | | | 136/255 |
| 2012/0273036 A1* | 11/2012 | Motoyoshi | H01L 31/0682 |
| | | | 136/255 |
| 2015/0228817 A1 | 8/2015 | Inoue et al. | |
| 2016/0380131 A1 | 12/2016 | Crafts et al. | |
| 2017/0236953 A1* | 8/2017 | Dutta | H01L 31/02363 |
| | | | 136/256 |

FOREIGN PATENT DOCUMENTS

| | | | |
|---|---|---|---|
| JP | 2011512687 A | 4/2011 |
| JP | 2014229876 A | 12/2014 |
| JP | 2015165526 A | 9/2015 |
| WO | 2014083804 A1 | 6/2014 |
| WO | 2014116778 A1 | 7/2014 |

OTHER PUBLICATIONS

Written Opinion of the International Searching Authority issued in corresponding International Application No. PCT/JP2017/047092; dated Apr. 10, 2018 (3 pages).

Extended European Search Report issued in the corresponding European Application No. 17903604.1, dated Nov. 21, 2019 (7 pages).

\* cited by examiner

SOLAR CELL, SOLAR CELL MODULE, AND SOLAR CELL MANUFACTURING METHOD

TECHNICAL FIELD

One or more embodiments of the present invention relate to a solar cell, a solar cell module, and a solar cell manufacturing method.

BACKGROUND

Although many types of solar cells are available, a solar cell using a single crystal silicon substrate is recently becoming mainstream. In such a solar cell, a structure referred to as texture, which is made uneven by arranging pyramidal mountains, is formed on a major surface of a single crystal silicon substrate. This is because the presence of such texture can suppress light reflection from a major surface that receives light, and can facilitate confining incident light in the solar cell.

Various developments have been made with respect to a structure of such texture; for example, in Patent Document 1, a summit of a pyramidal mountain is rounded, whereby the summit becomes less likely to chip, preventing carrier recombination due to chipping.

Patent Document 1: PCT International Publication No. WO 2014/083804

However, in a single crystal silicon substrate, the presence of a rounded shape on a light reception side is conversely likely to reflect the received light, which may deteriorate the efficiency of the solar cell.

SUMMARY

One or more embodiments of the present invention provide a solar cell or the like having an enhanced conversion efficiency.

As for a solar cell including a crystal substrate according to one or more embodiments of the present invention, among both major surfaces of the crystal substrate, at least part of a frontside major surface, which is the major surface that receives light, is an uneven surface formed by a first mountain and a first valley. The first mountain has a pointed summit ("first pointed summit") and a first slope face that is smooth from a mountain foot ("first mountain foot") to the summit.

At least part of a backside major surface, which is a surface opposite to the frontside major surface, is an uneven surface formed by a second mountain and a second valley. The second mountain has a pointed summit ("second pointed summit") and a second slope face, in which an angle of inclination from a mountain foot ("second mountain foot") to a mountain side differs from an angle of inclination from the mountain side to the summit.

The second slope face is configured as follows. That is, in a cross-section passing through the summit and being perpendicular to the mountain foot, the minimum angle $\theta[°]$ formed by a first imaginary straight line from the mountain foot to the summit and a second imaginary straight line from the mountain foot to an inflection point at the mountain side is $1.5 \leq \theta \leq 8$. In addition, the second mountain occupies 20% or more of an area of the backside major surface.

Further, as for a method for manufacturing a solar cell including a crystal substrate according to one or more embodiments of the present invention, among both major surfaces of the crystal substrate, when etching a side of a backside major surface, which is a surface opposite to a frontside major surface that receives light, a mixed solution of ozone dissolved in hydrofluoric acid is used for the backside major surface and an amorphous silicon layer to be laminated thereon. In this mixed solution, a value XY [weight $\%^2$] obtained by multiplying a hydrofluoric acid concentration X [weight %] and an ozone concentration Y [weight %] is between 0.005 and 0.285 inclusive in one or more embodiments.

According to one or more embodiments of the present invention, a solar cell or the like having an enhanced conversion efficiency is provided.

DETAILED DESCRIPTION OF THE EMBODIMENTS

Figure 1:
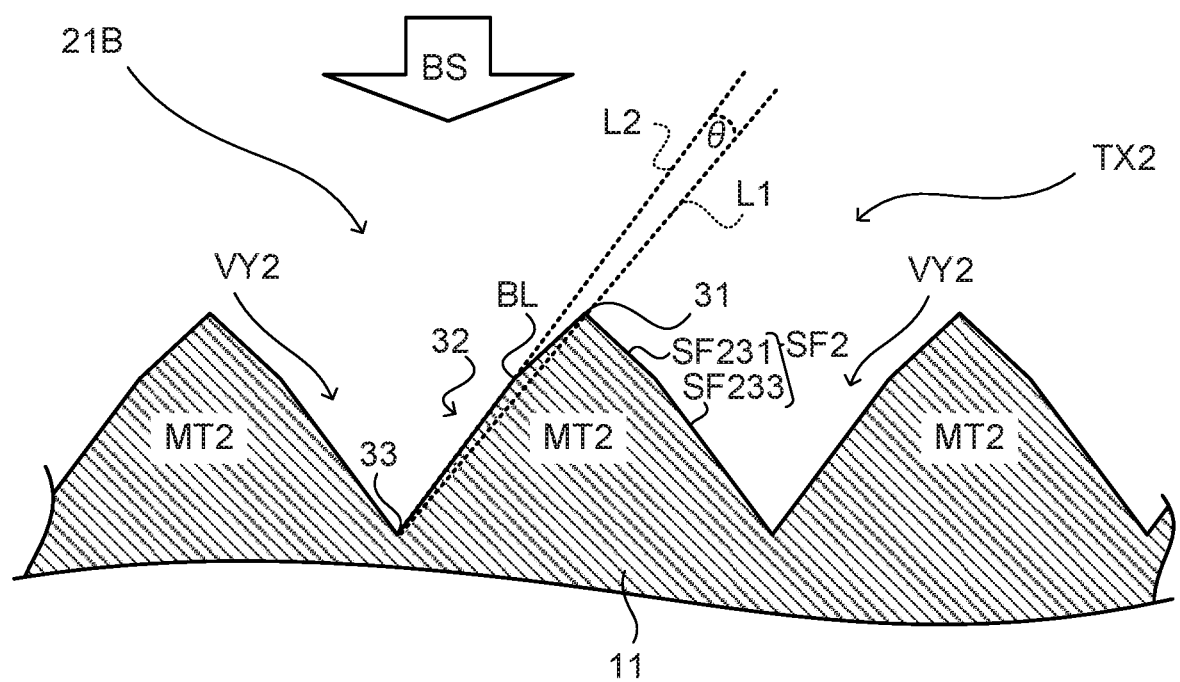
FIG. 1 is a cross-sectional view of mountains on an uneven surface of a major surface on a backside according to one or more embodiments of the present invention.

One or more embodiments of the present invention will be described below; however, the present invention is not limited thereto. For the sake of convenience, hatching, member reference numbers, etc. may be omitted; however, in such cases, other drawings shall be referred to. Dimensions of various members in the drawings are adjusted for the sake of visibility.

Figure 6:
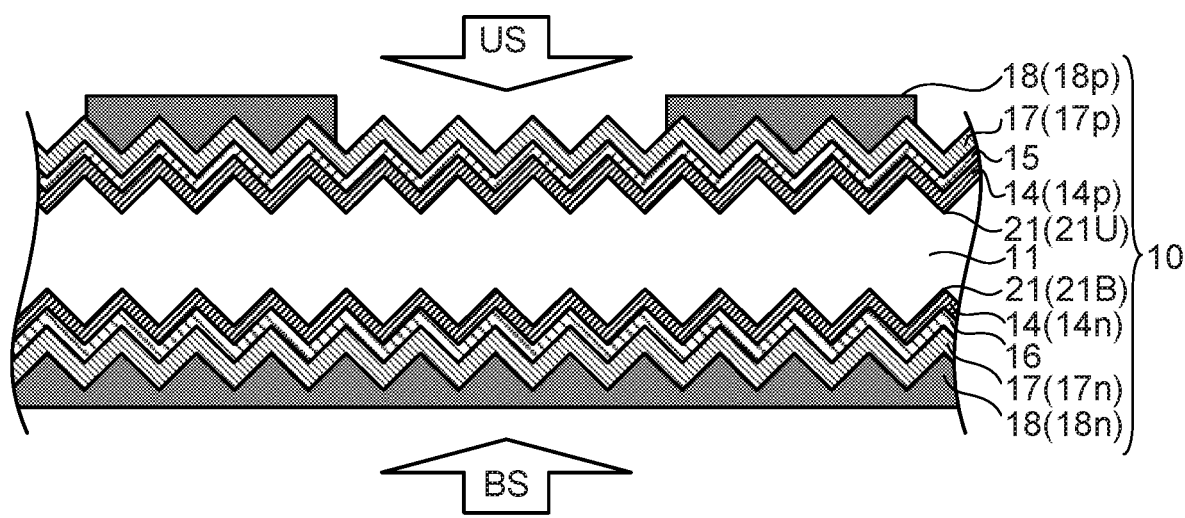
FIG. 6 is a cross-sectional view of a solar cell of a double-side type according to one or more embodiments of the present invention.

FIG. 6 shows a solar cell 10 using a silicon-made crystal substrate (crystal silicon substrate) 11. A solar cell 10 has two major surfaces, in which a side of a major surface 21U [upside major surface (frontside major surface)] being one side of the crystal substrate 11 is referred to as an upside (frontside) US, and a side of a major surface 21B [backside major surface] being the other side of the crystal substrate 11 is referred to as a backside BS. For the sake of convenience, the upside US will be described as a side (light reception side US) which is caused to more actively receive light than the backside BS, and the backside BS will be described as a non-light reception side BS which is caused not to actively receive light. The solar cell 10 will be described below by an example of a so-called heterojunction crystal silicon solar cell (hereinafter, heterojunction solar cell); however, the present invention is not limited thereto.

In one or more embodiments, the solar cell 10 includes the crystal substrate 11, an intrinsic (i-type) semiconductor layer 14, a p-type semiconductor layer 15, an n-type semiconductor layer 16, a transparent electrode layer 17, and a metal electrode layer 18.

In the following description, silicon is given as an example of the material of the semiconductor layer; however, the present invention is not limited thereto. For the sake of convenience, the reference numbers of members, which are individually associated with the p-type semiconductor layer 15 or the n-type semiconductor layer 16, may be assigned with the suffix "p"/"n". Since the conductivity types are different, such as p-type or n-type, one conductivity type may be referred to as a "first conductivity type" and the other conductivity type may be referred to as a "second conductivity type" in some cases.

The crystal substrate 11 may be single crystal or polycrystal. Hereinafter, a single crystal silicon substrate will be described as an example. The conductivity type of the crystal substrate 11 may be either a p-type or an n-type; however, in the following description, an n-type [first conductivity type crystal substrate] supposedly having a long carrier lifetime will be described as an example.

From the viewpoint of confining the received light, in one or more embodiments, the two major surfaces 21 (21U, 21B) of the crystal substrate 11 are an uneven surface formed by mountains MT and valleys VY. This will be described later in detail.

The intrinsic (i-type) semiconductor layer 14 (14p, 14n) covers the major surface 21 of the crystal substrate 11, thereby performing surface passivation while suppressing impurities from diffusing into the crystal substrate 11. An example of the material for the i-type semiconductor layer 14 may include amorphous silicon or microcrystal silicon (mixture of amorphous silicon and crystal silicon). In one or more embodiments, amorphous silicon formed of silicon and hydrogen may be used. In one or more embodiments, the i-type semiconductor layer 14 may have a thickness to an extent that may not adversely affect the power generation characteristics.

In one or more embodiments, the p-type semiconductor layer [second conductivity type semiconductor layer] 15 is a silicon layer doped with a p-type dopant (such as boron), and is formed, for example, on the intrinsic semiconductor layer 14p of the upside US in FIG. 6. From the viewpoint of suppressing impurities or reducing series resistance, the p-type semiconductor layer 15 may be formed of amorphous silicon in one or more embodiments.

Examples thereof may include a p-type hydrogenated amorphous silicon layer, a p-type amorphous silicon carbide layer, or a p-type amorphous silicon oxide layer. In one or more embodiments, a p-type amorphous silicon carbide layer or a p-type amorphous silicon oxide layer, which are wide-gap low refractive index layers, may be used, by which optical loss can be reduced.

In one or more embodiments, the n-type semiconductor layer [first conductivity type semiconductor layer] 16 is a silicon layer doped with an n-type dopant (such as phosphorus), and is formed, for example, on the intrinsic semiconductor layer 14n on the backside BS in FIG. 6. Like the p-type semiconductor layer 15, the n-type semiconductor layer 16 may be also formed of an amorphous silicon layer.

Meanwhile, an example of a film-forming method for a silicon-based thin film such as the i-type semiconductor layer 14, the p-type semiconductor layer 15 and the n-type semiconductor layer 16 may include a plasma CVD method. As the conditions for forming the silicon-based thin film by the plasma-CVD method, in one or more embodiments, the substrate temperature may be between 100° C. and 300° C.

inclusive, the pressure may be between 20 Pa and 2600 Pa inclusive, and the high-frequency power density may be between 0.004 W/cm² and 0.8 W/cm² inclusive.

As the source gas, in one or more embodiments, a silicon-containing gas such as $SiH_4$ or $Si_2H_6$, or a mixed gas of a silicon-based gas and $H_2$ may be used. As the dopant gas, in one or more embodiments, $B_2H_6$ or the like may be used for forming the p-type semiconductor layer 15, and $PH_3$ or the like may be used for forming the n-type semiconductor layer 16. Since the amount of impurities such as B or P added may be very small, a mixed gas of a dopant gas diluted with a source gas may be used.

In order to adjust the energy gap of the p-type semiconductor layer 15 or the n-type semiconductor layer 16, a gas containing different elements such as $CH_4$, $CO_2$, $NH_3$ or $GeH_4$ may be added, and the p-type semiconductor layer 15 or the n-type semiconductor layer 16 may be alloyed.

A laminate formed of the crystal substrate 11, the i-type semiconductor layer 14, the p-type semiconductor layer 15 and the n-type semiconductor layer 16 as described above is referred to as a photoelectric converter. Therefore, in the solar cell 10 as shown in FIG. 6, the p-type semiconductor layer 15/the i-type semiconductor layer 14p/the n-type crystal substrate 11/the i-type semiconductor layer 14n/and the n-type semiconductor layer 16 are laminated in this order from the upside US to the backside BS.

The transparent electrode layer 17 (17p, 17n) is formed of a conductive oxide, which is translucent to an extent that transmits the light received. Such transparent electrode layer 17 is formed so as to cover the p-type semiconductor layer 15 or the n-type semiconductor layer 16, thereby being electrically connected to the semiconductor layers 15/16. Thus, the transparent electrode layer 17 functions as a transport layer for guiding carriers generated in the p-type semiconductor layer 15 or the n-type semiconductor layer 16. Although FIG. 6 shows an example of the single transparent electrode layer 17, the present invention is not limited thereto, and a multilayered transparent electrode layer 17 may be used.

In one or more embodiments, the content of the conductive oxide in the transparent electrode layer 17 is greater than 50% by weight (such a ratio is described as a principal component). From the viewpoint of conductivity, the content of the conductive oxide may be 70% or more by weight in one or more embodiments of the present invention, and may be 90% or more by weight in another embodiment of the present invention.

Examples of the conductive oxide may include a material such as zinc oxide, indium oxide or tin oxide, alone or in combination. From the viewpoint of conductivity, optical characteristics, or long-term reliability, an indium-based oxide containing indium oxide may be used in one or more embodiments. In one or more embodiments, indium tin oxide (ITO) as a principal component may be used.

A doping agent may be added to the transparent electrode layer 17. For example, when zinc oxide is used as the transparent electrode layer 17, aluminum, gallium, boron, silicon, carbon, or the like may be used as the doping agent. When indium oxide is used as the transparent electrode layer 17, zinc, tin, titanium, tungsten, molybdenum, silicon, or the like may be used as the doping agent. When tin oxide is used as the transparent electrode layer 17, fluorine or the like may be used as the doping agent.

The doping agent may be added to both or only one of the transparent electrode layer 17p covering the p-type semiconductor layer 15 and the transparent electrode layer 17n covering the n-type semiconductor layer 16. In one or more embodiments, the doping agent may be added to the transparent electrode layer 17p of the light reception side US, since the resistance of the transparent electrode layer 17p itself is lowered, and the resistance loss between the transparent electrode layer 17p and the metal electrode layer 18p is suppressed.

From the viewpoint of translucency, conductivity, or light reflection reduction, in one or more embodiments, the thickness of the transparent electrode layer 17 may be between 10 nm and 140 nm inclusive. When the film thickness is 10 nm or more, the transparent electrode layer 17 has sufficient conductivity to transport carriers to the metal electrode layer 18; when the film thickness is 140 nm or less, light absorbed by the transparent electrode layer 17 due to thickness does not excessively increase, thereby suppressing decrease in the photoelectric conversion efficiency. That is, if the thickness of the transparent electrode layer 17 is within the above-mentioned range, increase in carrier density is suppressed even inside the transparent electrode layer 17, and decrease in photoelectric conversion efficiency due to decrease in transmittance in the infrared region is also suppressed.

The film-forming method for the transparent electrode layer 17 is not limited in particular; however, a physical vapor deposition (PVD) method such as a sputtering method, a chemical vapor deposition (MOCVD) method using a reaction of an organometallic compound with oxygen or water, or the like can be used. In any of the film-forming methods, energy from heat or plasma discharge may be used.

The temperature for forming the transparent electrode layer 17 (substrate temperature) is appropriately set. For example, when amorphous silicon is used for the silicon-based thin film, the substrate temperature may be 200° C. or less in one or more embodiments. This suppresses desorption of hydrogen from amorphous silicon, or suppresses generation of dangling bonds to silicon atoms due to desorption, and consequently improves the conversion efficiency of the solar cell.

In one or more embodiments, the metal electrode layer 18 (18p, 18n) is formed of a conductive metal. The metal electrode layer 18 is formed so as to cover the transparent electrode layer 17, thereby being electrically connected to the transparent electrode layer 17. As a result, the metal electrode layer 18 further transports carriers transported from the transparent electrode layer 17. Therefore, the metal electrode layer 18 may be referred to as a collecting electrode.

As the material for the metal electrode layer 18, in one or more embodiments of the present invention, a material having a high reflectance in the near-infrared to infrared region and having a high conductivity or chemical stability may be used. Examples of the material satisfying such characteristics include silver or aluminum.

Examples of the film-forming method for the metal electrode layer 18 may include, without limitation in particular, a physical vapor deposition method such as a sputtering method or a vacuum evaporation method, a printing method such as screen printing, an electrolytic plating method using a screen-printed metal as a seed, or the like.

In practical use, the solar cell 10 as described above is modularized. Modularization of the solar cell 10 is accomplished, for example, such that the metal electrodes 18 of the plurality of solar cells 10 are arranged in a matrix, electrically connected to each other via conductive tab wires, and sealed between a pair of transparent substrates.

Here, surface shapes of the upside (light reception side) US and the backside (non-light reception side) BS of the solar cell 10 will be described with reference to FIG. 6 as well as FIGS. 1 to 5.

Figure 2:
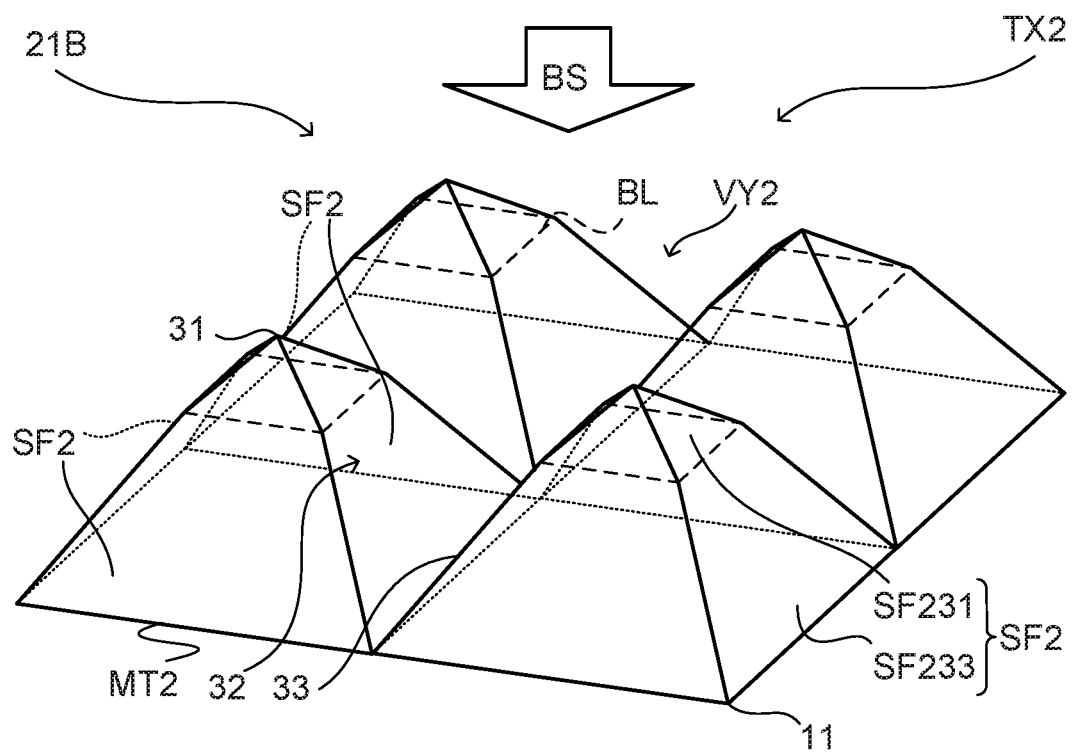
FIG. 2 is an enlarged perspective view of part of a major surface of a crystal substrate on a backside of a solar cell according to one or more embodiments of the present invention.
Figure 3:
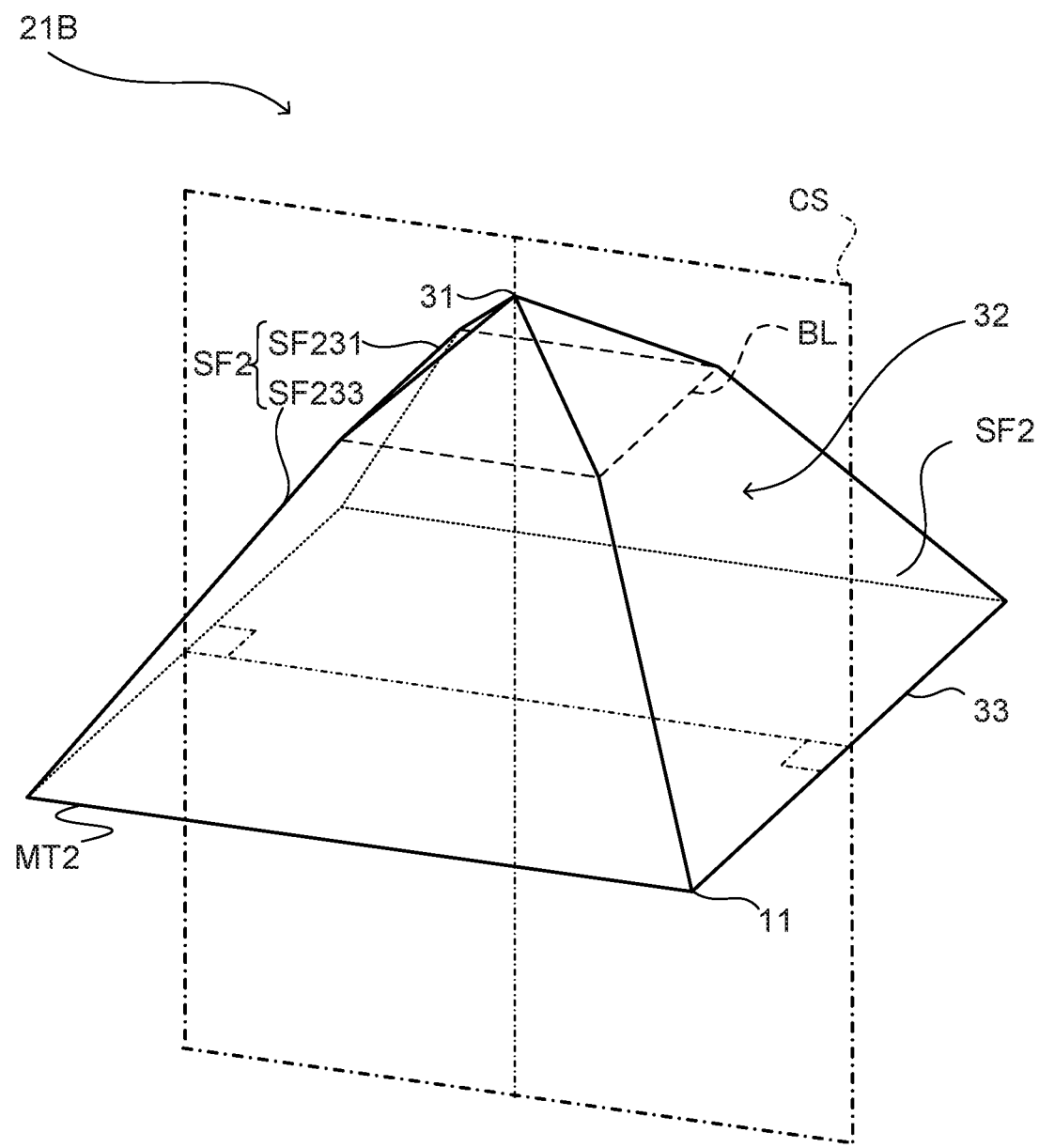
FIG. 3 is an explanatory view for explaining a cross-section according to one or more embodiments of the present invention.
Figure 4:
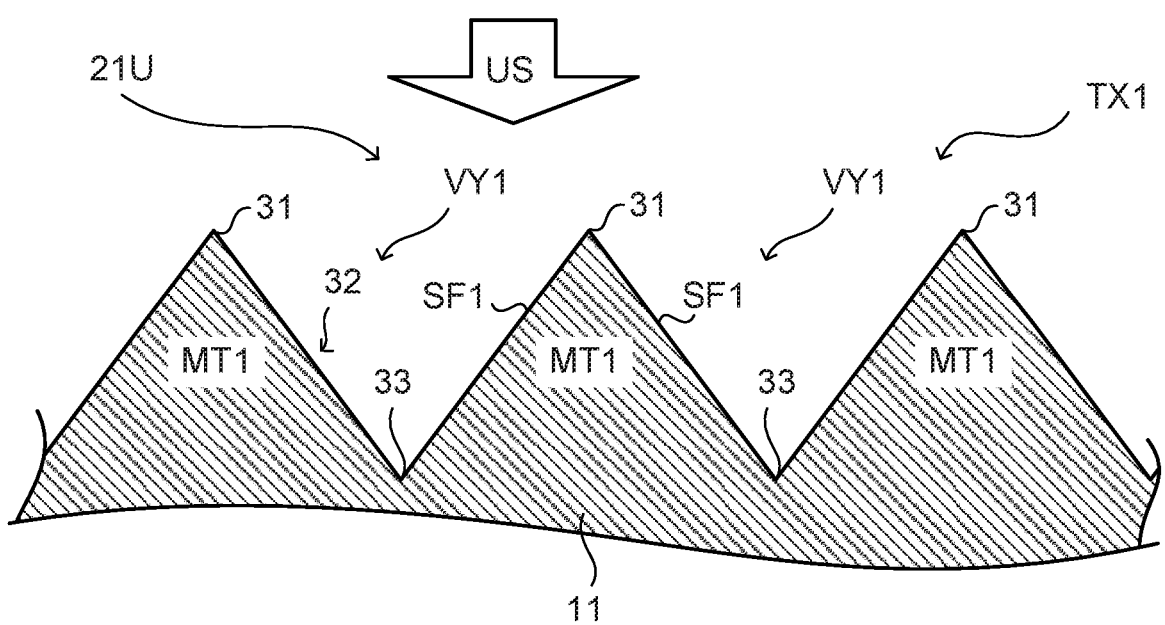
FIG. 4 is a cross-sectional view of mountains on an uneven surface of a major surface on a frontside according to one or more embodiments of the present invention.
Figure 5:
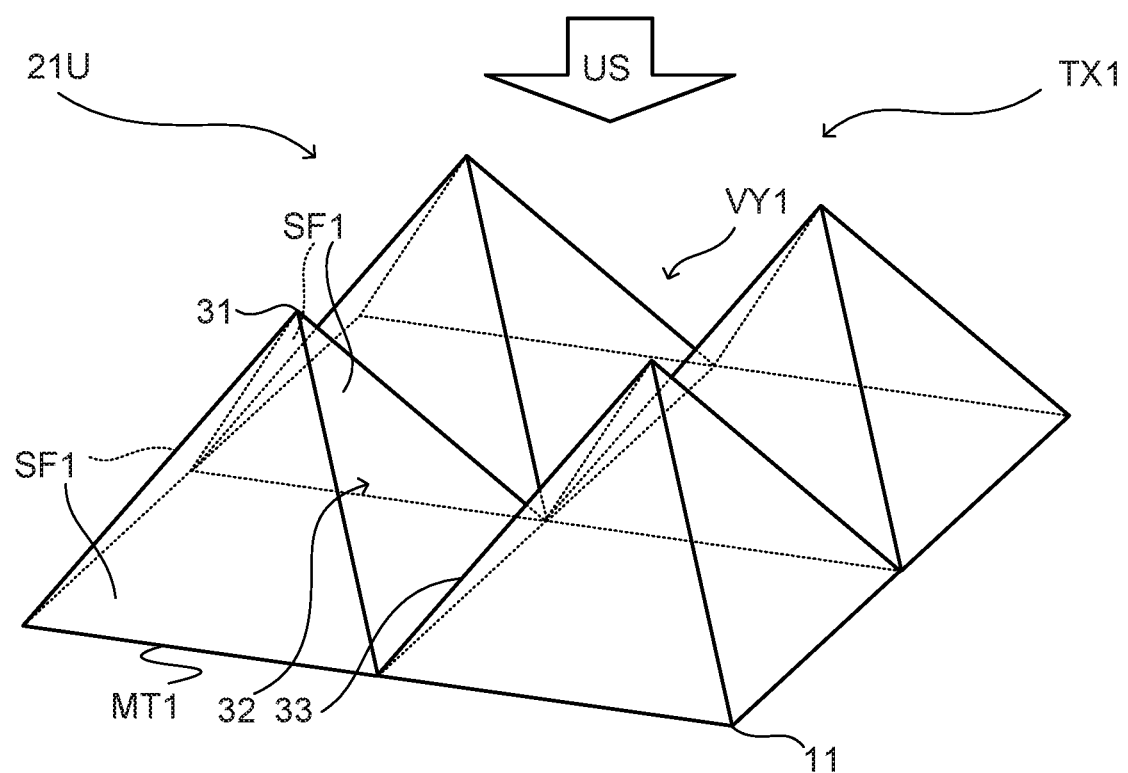
FIG. 5 is an enlarged perspective view showing part of a major surface of a crystal substrate on a frontside of a solar cell according to one or more embodiments of the present invention.

FIG. 5 is an enlarged perspective view showing part of the major surface 21U of the crystal substrate 11 on the upside US of the solar cell 10. FIG. 2 is an enlarged perspective view showing part of the major surface 21B of the crystal substrate 11 on the backside BS of the solar cell 10. FIG. 3 is an explanatory view for explaining a cross-section CS described later. FIG. 4 is a cross-sectional view of mountains MT1 on the uneven surface of the major surface 21U. FIG. 1 is a cross-sectional view of mountains MT2 on the uneven surface of the major surface 21B.

As shown in FIGS. 6, 5 and 2, at least part of both the major surfaces 21B and 21U of the crystal substrate 11 has an uneven surface formed by pyramidal mountains MT (MT1/MT2), which have slope faces SF (SF1/SF2), and valleys VY (VY1/VY2). An uneven surface is created such that, when the silicon substrate 11 having the (100) plane is anisotropically etched using an alkaline solution, the (111) plane having a slower etching rate will preferentially appear on the surface.

As shown in FIGS. 5 and 4, the mountain MT1 [first mountain MT1] on at least part of the major surface 21U [upside major surface] on the upside US of the crystal substrate 11 has a pointed summit 31 and a slope face SF1 [first slope face SF1] that is smooth from a mountain foot 33 to the summit 31.

The smooth slope face SF1 herein means a surface in which the slope face SF1 does not internally have a broken line (see the broken line BL in FIGS. 1 to 3). An example thereof is a slope face SF1 created by performing known alkaline etching on the silicon substrate 11 as described above (hereinafter, an uneven surface created by including the mountain MT1 having the slope face SF1 is referred to as a first texture surface TX1). The pointed shape means a shape in which the summit 31 is not spherical but tapered and angular, in which the shape of the summit 31 is understandable as a point in the cross-section CS described later.

On the other hand, as shown in FIG. 2, the mountain MT2 [second mountain MT2] on at least part of the major surface 21B [backside major surface] of the backside BS has a pointed summit 31 and a slope face SF2 [second slope face SF2], in which an angle of inclination from the mountain foot 33 to a mountain side 32 differs from an angle of inclination from the mountain side 32 to the summit 31. That is, since the broken line (border line) BL is generated in the mountain side 32 between the summit 31 and the mountain foot 33, the angle of inclination of the slope face SF2 differs between one part (SF231) and the other part (SF233).

The cross-section CS is used for specifying the shape of the mountain MT on the uneven surface (21B, 21U) in detail; as shown in FIG. 3, the cross-section CS is a cross-section (cross-sectional direction) CS passing through the summit 31 of the mountain MT (the mountain MT1 is illustrated as an example in FIG. 3) and being orthogonal to the mountain foot 33.

FIG. 1 shows a cross-section CS of the mountain MT2 on the major surface 21B of the backside BS, and FIG. 4 shows a cross-section CS of the mountain MT1 on the major surface 21U of the upside US. As shown in FIG. 4, since the slope face SF1 is smooth in the cross-section of the mountain MT1 on the major surface 21U, the entire surface of the slope face SF1 has the same angle of inclination.

On the other hand, as shown in FIG. 1, the cross-section CS of the mountain MT2 on the backside 21B is as follows. That is, a minimum angle $\theta[°]$ formed by a first imaginary straight line L1 from the mountain foot 33 to the summit 31 and a second imaginary straight line L2 from the mountain foot 33 to the broken line BL [inflection point BL in the cross-section CS] of the mountain side 32 is $1.5 \leq \theta \leq 8$ (Equation 1) in one or more embodiments of the present invention.

The mountain MT2 having such a slope face SF2 occupies 20% or more of the area of the backside 21B in one or more embodiments of the present invention. For example, in the case of the solar cell 10 as shown in FIG. 6, the mountain MT2 having the slope face SF2 occupies the entire surface of the backside 21B (hereinafter, an uneven surface generated by including the mountain MT2 having the slope face SF2 is referred to as a second texture surface TX2).

Figure 7:
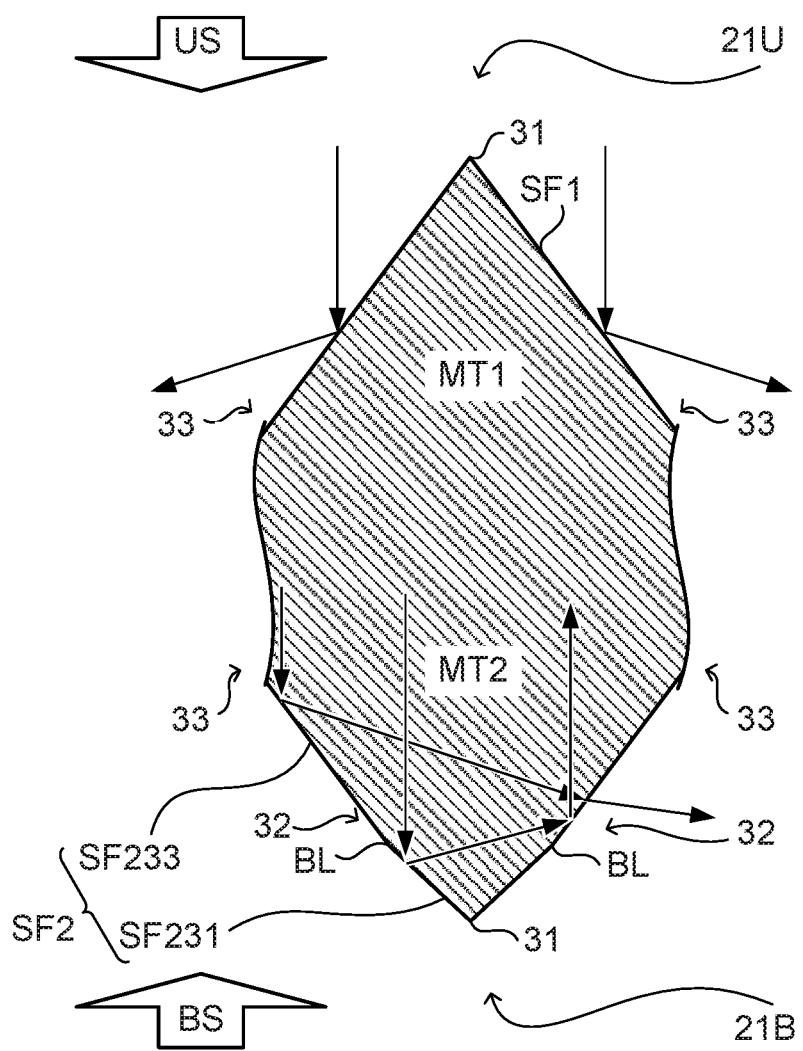
FIG. 7 is an explanatory view for explaining the progress of light.

With this structure, as shown in the explanatory view for explaining light beams in FIG. 7 (arrows representing light), on the major surface 21U on the light reception side US, for example, when external light is reflected by the slope face SF1, the reflected light is likely to travel towards the mountain foot 33 due to the single smooth surface. Therefore, a large amount of light is likely to enter the crystal substrate 11.

On the major surface 21B of the non-light reception side BS, for example, when light having entered the crystal substrate 11 is reflected by the slope face SF2, the reflected light travels in different directions depending on whether the light is incident on the slope face part SF233 to the mountain foot side, or incident on the slope face part SF231 to the summit side.

For example, when light traveling from the same direction reaches the slope face part SF233 and the slope face part SF231, if the light reflected by the slope face part SF233 is finally transmitted to the outside, the light reflected by the slope face part SF231, which is a different reflective surface, travels in a direction different from the light having been transmitted to the outside and is unlikely to be transmitted to the outside. In other words, an increased variety of light travels inside the crystal substrate 11. Therefore, a larger amount of light is likely to enter the crystal substrate 11. Therefore, the photoelectric conversion efficiency of the solar cell 10 improves.

The minimum angle $\theta[°]$ is measured, for example, by analyzing an image obtained by a scanning electron microscope (SEM) that photographed a cross-section orthogonal to the major surface 21 of the crystal substrate 11 in a range of 10 mm. In this case, the first imaginary straight line L1 and the second imaginary straight line L2 were defined by analyzing images of five mountains MT2 confirmed in the images, and a mean value of minimum angles obtained from these images was set to $\theta[°]$.

The minimum angle $\theta[°]$ may be $2 \leq \theta \leq 5.5$ in one or more embodiments of the present invention, and may be $2.3 \leq \theta \leq 2.6$ in another embodiment of the present invention.

The solar cell 10 of a double-side contact type has been described above, in which the p-type semiconductor layer 15 is formed on the side of the major surface 21U on the upside (light reception side) US, and the n-type semiconductor layer 16 is formed on the side of the major surface 21B of the backside (non-light reception side) BS; however, the present invention is not limited thereto.

Figure 8:
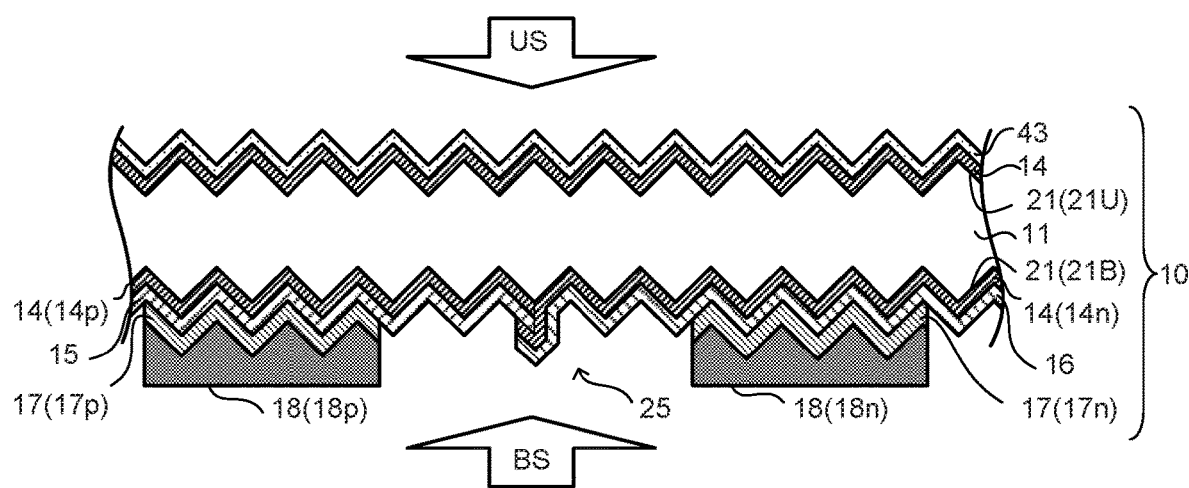
FIG. 8 is a cross-sectional view of a solar cell of a back contact type according to one or more embodiments of the present invention.

For example, as shown in the cross-sectional view of FIG. 8, the solar cell 10 may be of a back contact type, in which the n-type semiconductor layer 16 and the p-type semiconductor layer 15 are formed on the major surface 21B of the backside BS.

In the solar cell 10 of such a back contact type, the mountains MT2 satisfying the above equation (1) are arranged in an area covered with the n-type semiconductor layer 16 (more specifically, an i-type semiconductor layer 14n immediately below the n-type semiconductor layer 16) on the major surface 21B of the crystal substrate 11.

Figure 9:
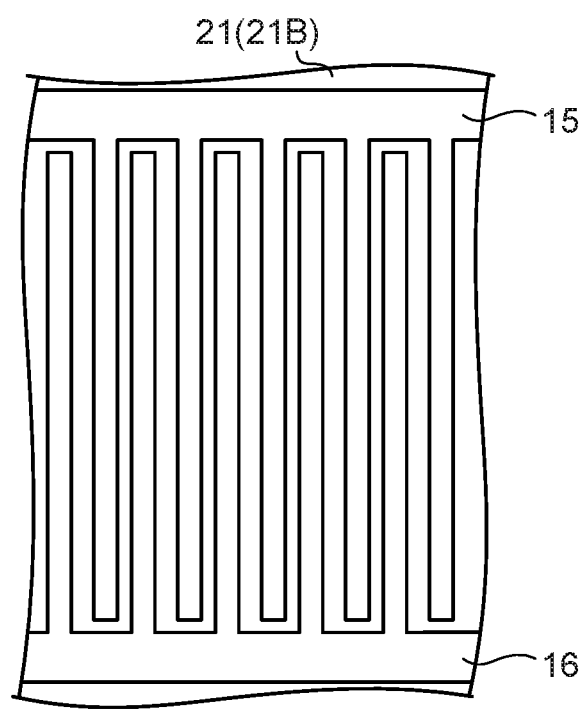
FIG. 9 is a schematic plan view of a solar cell of a back contact type according to one or more embodiments of the present invention.

As shown in the schematic plan view of FIG. 9, each of the semiconductor layers 15 and 16 is made into a comb-tooth shape, and the teeth of one comb-tooth shape are arranged between the teeth of the other comb-tooth shape. In one or more embodiments of the present invention, the mountains MT2 having such a slope face SF2 occupy 20% or more of the area of the backside 21B. For example, in the solar cell 10 as shown in FIG. 9, the mountains MT2 having the slope face SF2 occupy 50% of the area of the backside 21B.

Figure 10A:
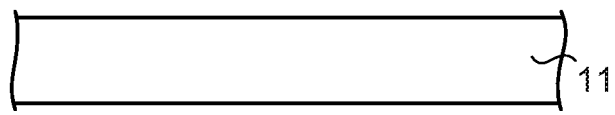
FIG. 10A is an explanatory view showing a process of manufacturing a solar cell of a double-side contact type according to one or more embodiments of the present invention.

Here, an example of a method for manufacturing the solar cell 10 of a double-side contact type is described with reference to FIGS. 10A to 10I. First, an n-type crystal substrate 11 as shown in FIG. 10A is prepared.

Figure 10B:
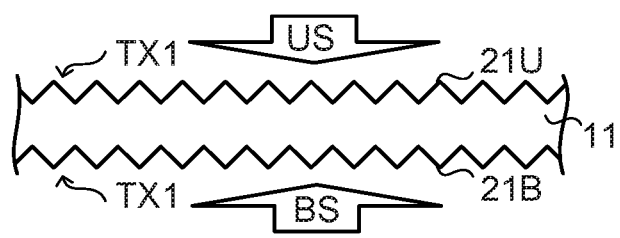
FIG. 10B is an explanatory view showing a process of manufacturing a solar cell of a double-side contact type according to one or more embodiments of the present invention.

Thereafter, as shown in FIG. 10B, the crystal substrate 11 having the (100) plane is etched using an alkaline solution. This etching is anisotropic etching, in which the (111) plane having a slower etching rate preferentially appears on the surface. As a result, both the major surfaces 21U and 21B of the crystal substrate 11 change to the first texture surface TX1 [first texture surface forming step].

Examples of alkali components in the etching solution may include a sodium hydroxide, a potassium hydroxide, or an alkali metal such as calcium hydroxide, or a hydroxide of an alkaline earth metal. In one or more embodiments, a sodium hydroxide or a potassium hydroxide may be used. The alkali component may be a single component or a mixture of two or more components.

The alkali concentration in the etching solution may be between 1% and 20% by weight inclusive in one or more embodiments of the present invention, between 2% and 15% by weight inclusive in another embodiment of the present invention, and between 3% and 10% by weight inclusive in yet another embodiment of the present invention. In anisotropic etching, IPA (isopropyl alcohol) or the like may be added to an alkaline solution using potassium hydroxide or sodium hydroxide as an etching solution.

Figure 10C:
FIG. 10C is an explanatory view showing a process of manufacturing a solar cell of a double-side contact type according to one or more embodiments of the present invention.

Next, as shown in FIG. 10C, a sacrificial layer 41 is formed of, e.g., i-type amorphous silicon on the major surface 21B of the backside BS of the crystal substrate 11. The major surface 21B, on which the sacrificial layer 41 is formed, is etched using a mixed solution of ozone dissolved in hydrofluoric acid or the like (described later), whereby obtaining the slope face SF2.

Figure 10D:
FIG. 10D is an explanatory view showing a process of manufacturing a solar cell of a double-side contact type according to one or more embodiments of the present invention.
Figure 10E:
FIG. 10E is an explanatory view showing a process of manufacturing a solar cell of a double-side contact type according to one or more embodiments of the present invention.

Subsequently, as shown in FIG. 10D, the i-type semiconductor layer 14p is formed on the major surface 21U of the upside US of the crystal substrate 11, and the p-type semiconductor layer 15 is further formed on the layer 14p. Thereafter, as shown in FIG. 10E, a resist film 42 is formed as a protective film on the p-type semiconductor layer 15.

Figure 10F:
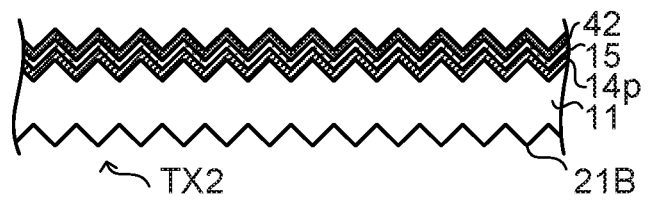
FIG. 10F is an explanatory view showing a process of manufacturing a solar cell of a double-side contact type according to one or more embodiments of the present invention.

The crystal substrate 11 having the resist film 42 on the outermost surface of the upside US and having the sacrificial layer 41 on the outermost surface of the backside BS is etched using, e.g., a mixed solution of hydrofluoric acid and an oxidizing solution [second texture surface forming step]. Through this etching, as shown in FIG. 10F, the sacrificial layer 41 [amorphous silicon layer] and the major surface 21B of the backside BS are etched, and the first texture surface TX1 of the major surface 21B changes to the second texture surface TX2. On the other hand, due to the resist film 42, the major surface 21U of the upside US is not etched and remains the first texture surface TX1.

Etching of an amorphous silicon layer or a crystal substrate (silicon substrate) using a mixed solution of ozone dissolved in hydrofluoric acid proceeds by repeatedly forming an oxide film on a silicon surface using ozone and etching the oxide film using hydrofluoric acid. The rate of forming the oxide film using ozone and the rate of etching using hydrofluoric acid are affected by an uneven surface. That is, in the immediate vicinity of the uneven surface of the silicon substrate, the mixed solution more easily migrates in the vicinity of the summits of the uneven surface, and a larger amount of ozone and hydrofluoric acid is likely to be supplied, than in the vicinity of the valleys. Therefore, the etching rate tends to be higher in the vicinity of the summits of the uneven surface than in the vicinity of the valleys.

An example of such a mixed solution of hydrofluoric acid and an oxidizing solution may include a mixed solution of ozone dissolved in hydrofluoric acid. In this mixed solution, the value XY [weight %$^2$] obtained by multiplying the hydrofluoric acid concentration X [weight %] and the ozone concentration Y [weight %] may be between 0.005 and 0.285 inclusive in one or more embodiments of the present invention, between 0.015 and 0.100 inclusive in another embodiment of the present invention, and between 0.030 and 0.050 inclusive in yet another embodiment of the present invention. This is because the second texture surface TX2 is appropriately formed when the value XY falls within the above-mentioned ranges.

Further, the hydrofluoric acid concentration X may be between 1.5% and 25% by weight inclusive in one or more embodiments of the present invention. Even within this range, the hydrofluoric acid concentration X may be 5% by weight or more in one or more embodiments of the present invention, 7% by weight or more in another embodiment of the present invention, and 8% by weight or more in yet another embodiment of the present invention. The ozone concentration Y is not limited in particular, as long as the value XY falls within the above-mentioned ranges.

Figure 10G:
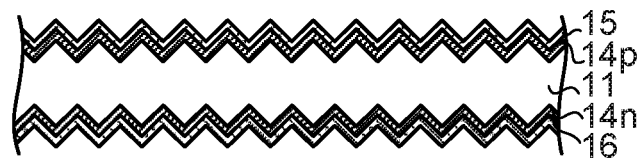
FIG. 10G is an explanatory view showing a process of manufacturing a solar cell of a double-side contact type according to one or more embodiments of the present invention.

Next, as shown in FIG. 10G, the resist film 42 (see FIG. 10F) is removed, and the i-type semiconductor layer 14n is formed on the major surface 21B of the crystal substrate 11 which became the second texture surface TX2. The n-type semiconductor layer 16 is further formed on the layer 14n.

Figure 10H:
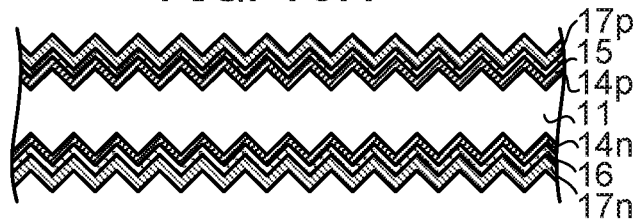
FIG. 10H is an explanatory view showing a process of manufacturing a solar cell of a double-side contact type according to one or more embodiments of the present invention.
Figure 10I:
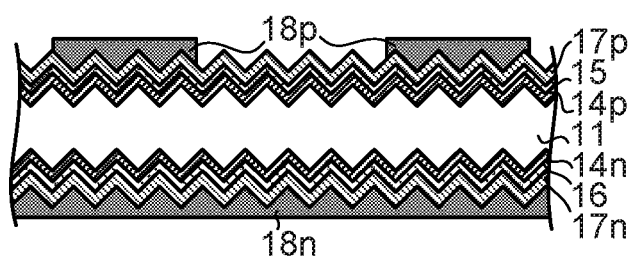
FIG. 10I is an explanatory view showing a process of manufacturing a solar cell of a double-side contact type according to one or more embodiments of the present invention.

Thereafter, as shown in FIG. 10H, the transparent electrode layer 17 is formed on the upside US and the backside BS of the crystal substrate 11. Further, as shown in FIG. 10I, a planar metal electrode 18n is formed on the transparent electrode layer 17n of the backside BS of the crystal substrate 11 by, e.g., a sputtering method, and a linear metal electrode layer 18p is formed on the transparent electrode layer 17p of the upside US by using a mesh screen (not shown) that has an opening. Thus, the formation of each layer in the solar cell 10 of a double-side contact type is completed.

Next, an example of a method for manufacturing the solar cell 10 of a back contact type will be described with reference to FIGS. 11A to 11F. First, the n-type crystal substrate 11 is prepared and subsequently etched using an alkaline solution (see FIG. 11A), as in the case of the solar cell 10 of a double-side contact type. Through this etching, both the major surfaces 21U and 21B of the crystal substrate 11 change to the first texture surface TX1 [first texture surface forming step].

Figure 11A:
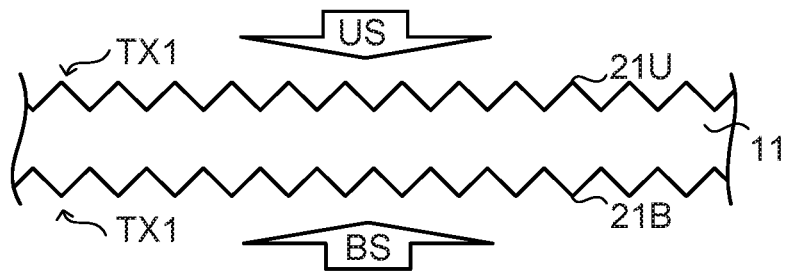
FIG. 11A is an explanatory view showing a process of manufacturing a solar cell of a back contact type according to one or more embodiments of the present invention.
Figure 11B:
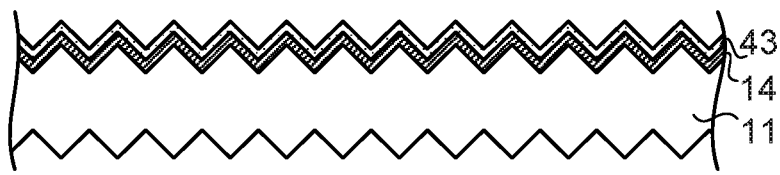
FIG. 11B is an explanatory view showing a process of manufacturing a solar cell of a back contact type according to one or more embodiments of the present invention.

Thereafter, as shown in FIG. 11B, for example, the i-type amorphous silicon layer 14 is formed on the major surface 21U of the upside US of the crystal substrate 11, and an anti-reflective layer 43 is further formed on the i-type amorphous silicon layer 14. From the viewpoint of light confinement, in one or more embodiments, the anti-reflective layer 43 may be formed of silicon nitride or silicon oxide, which has a suitable light absorption coefficient and refractive index.

Figure 11C:
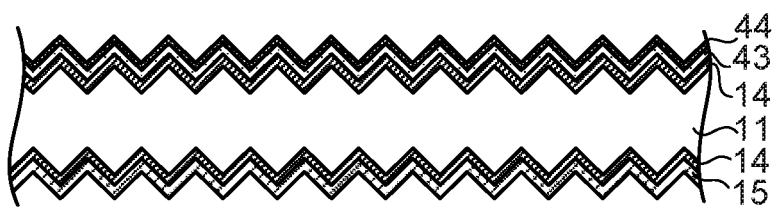
FIG. 11C is an explanatory view showing a process of manufacturing a solar cell of a back contact type according to one or more embodiments of the present invention.

Subsequently, as shown in FIG. 11C, the i-type semiconductor layer 14 is formed on the major surface 21B of the backside BS of the crystal substrate 11, and the p-type semiconductor layer 15 is further formed on the layer 14. The resist film 44 is formed on substantially the entire surface of the anti-reflective layer 43 of the upside US of the crystal substrate 11.

Next, both the i-type semiconductor layer 14 and the p-type semiconductor layer 15, which are amorphous silicon layers, are patterned into a desired shape. For example, a resist film (not shown) is formed on part of the p-type semiconductor layer 15, and another part uncovered with the resist film is etched [second texture surface forming step]. In this etching, for example, a mixed solution of hydrofluoric acid and an oxidizing solution is used, as in the case of the solar cell 10 of a double-side contact type.

Figure 11D:
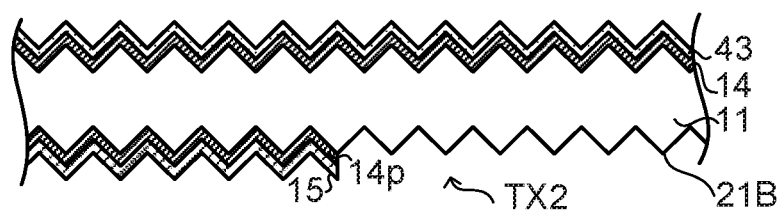
FIG. 11D is an explanatory view showing a process of manufacturing a solar cell of a back contact type according to one or more embodiments of the present invention.

Then, as shown in FIG. 11D, the p-type semiconductor layer 15, the i-type semiconductor layer 14, and the major surface 21B of the backside BS are etched, and the first texture surface TX1 of the major surface 21B changes to the second texture surface TX2. As shown in FIG. 11D, after the second texture surface TX2 is formed, the resist film 44 (see FIG. 11C) is removed; however, during the previous etching, the major surface 21U of the upside US is not etched due to the resist film 44 and remains the first texture surface TX1.

Figure 11E:
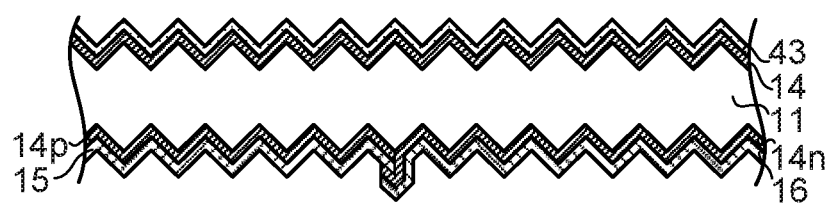
FIG. 11E is an explanatory view showing a process of manufacturing a solar cell of a back contact type according to one or more embodiments of the present invention.

Next, the i-type semiconductor layer 14n is formed on the p-type semiconductor layer 15 and the exposed major surface 21 B, and the n-type semiconductor layer 16 is formed on the layer 14n. As shown in FIG. 11E, the i-type semiconductor layer 14n and the n-type semiconductor layer 16 are patterned into a desired shape by, e.g., etching using a resist film (not shown).

Figure 11F:
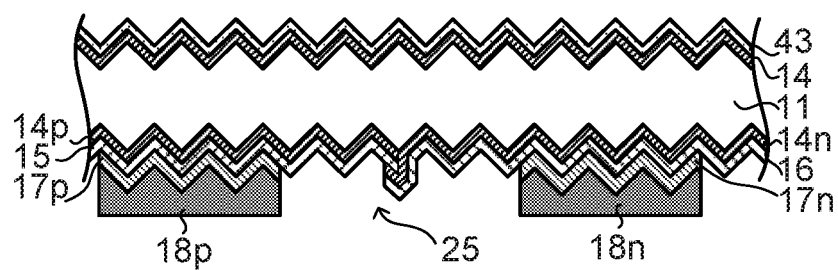
FIG. 11F is an explanatory view showing a process of manufacturing a solar cell of a back contact type according to one or more embodiments of the present invention.

Thereafter, the transparent electrode layer 17 (17p, 17n) is formed on the backside BS of the crystal substrate 11 by a sputtering method using a mask so as to form a separation trench 25 (see FIG. 11F). The separation trench 25 makes it difficult for leakage to occur. Further, as shown in FIG. 11F, a linear metal electrode layer 18 (18p, 18n) is formed on the transparent electrode layer 14 by using a mesh screen that has an opening (not shown). Thus, the formation of each layer in the solar cell 10 of a back contact type is completed.

As described above, in either the solar cell 10 of a double-side contact type or the solar cell 10 of a back contact type, the mountain MT1 on the uneven surface formed on at least part of the major surface 21U of the light reception side US in the crystal substrate 11 has the pointed summit 31 and the slope face SF1 which is smooth from the mountain foot 33 to the summit 31. On the other hand, the mountain MT2 on the uneven surface formed on at least part of the major surface 21B of the non-light reception side BS has the pointed summit 31 and the slope face SF2, in which the angle of inclination from the mountain foot 33 to the mountain side 32 differs from the angle of inclination from the mountain side 32 to the summit 31.

As for the mountain MT2, in the cross-section CS passing through the summit 31 and being perpendicular to the mountain foot 33, the minimum angle $\theta[°]$ formed by the first imaginary straight line L1 from the mountain foot 33 to the summit 31 and the second imaginary straight line L2 from the mountain foot 33 to the inflection point BL of the mountain side 32 is $1.5 \leq \theta \leq 8$ (Equation 1) in one or more embodiments of the present invention. The mountains MT2 occupy 20% or more of the area of the major surface 21B (the second texture surface TX2 occupies 20% or more of the area of the major surface 21B) in one or more embodiments of the present invention.

With this structure, as described above, the solar cell 10 can sufficiently capture light and secure a high photoelectric conversion efficiency. Therefore, the solar cell module modularizing the solar cell 10 has an extremely high power-generation capability.

The minimum angle $\theta[°]$ may be $2 \leq \theta \leq 5.5$ in some embodiments, and $2.3 \leq \theta \leq 2.6$ in another embodiment.

In the manufacturing process of either the solar cell 10 of a double-side contact type or the solar cell 10 of a back contact type, in relation to the major surfaces 21U and 21B of the crystal substrate 11, when etching the side of the major surface 21B opposite to the major surface 21U that receives light, the major surface 21B and the amorphous silicon layer laminated on the major surface 21B are etched using a mixed solution of ozone dissolved in hydrofluoric acid (which may hereinafter be referred to as ozone hydrofluoric acid) in one or more embodiments of the present invention.

When using an etching solution such as ozone hydrofluoric acid, which is less acidic than, e.g., hydrofluoric nitric acid, the resist film 42 (see FIG. 10F) of the solar cell 10 of a double-side contact type or the resist film 44 (FIG. 11C) of the solar cell 10 of a back contact type can hardly be damaged by etching. Therefore, unexpected structural changes are unlikely to occur.

By etching the crystal substrate 11 together with the amorphous silicon layer, the amorphous silicon layer serves as a buffer layer against the etching of the crystal substrate 11, whereby completing the second texture surface TX2. The synergistic effect by the second texture surface TX2 of the backside BS and the first texture surface TX1 of the upside US enhances the optical confinement effect in the crystal substrate 11.

The thickness of the amorphous silicon layer may have a distribution. For example, when forming the amorphous silicon layer, which is composed of the i-type semiconductor layer 14 and the p-type semiconductor layer 15 of the backside 21B of the crystal substrate 11 in the solar cell 10 of a back contact type shown in FIG. 11C, the amorphous silicon layer may be formed so that the film thickness of the amorphous silicon layer at the summit 31 of the mountain MT2 is smaller than the film thickness of the amorphous silicon layer at the mountain side 32 of the mountain MT2.

For example, after an i-type amorphous silicon thin film is formed by the plasma CVD method, plasma discharging is performed while introducing hydrogen into the CVD chamber, and a hydrogen plasma treatment (hydrogen plasma etching) is performed on the surface of the i-type amorphous silicon thin film, whereby the i-type semiconductor layer 14 can be formed, in which the film thickness at the summit 31 of the mountain MT2 is smaller than the film thickness at the mountain side 32 of the mountain MT2. Thereafter, by forming the p-type semiconductor layer 15 on the i-type semiconductor layer 14, an amorphous silicon layer can be formed, in which the film thickness at the summit 31 of the mountain MT2 is smaller than the film thickness at the mountain side 32 of the mountain MT2. As a result, in the subsequent etching using a mixed solution of ozone dissolved in hydrofluoric acid or the like, in which the amorphous silicon layer serves as a buffer layer [second texture surface forming step], the crystal substrate 11 is etched in the vicinity of the summit 31 having a smaller film thickness of the amorphous silicon layer, whereby the above-described second texture surface TX2 can be easily formed.

Instead of the hydrogen plasma treatment which only introduces hydrogen (hydrogen plasma etching), a hydrogen plasma treatment may be performed while introducing hydrogen and a small amount of silicon-containing gas (e.g. $SiH_4$) into the CVD chamber. In this case, the etching by hydrogen plasma and the film formation by CVD using a silicon-containing gas existing in the atmosphere proceed in parallel; however, by adjusting the condition and duration of the hydrogen plasma treatment, the film thickness at the summit 31 of the mountain MT2 can be made smaller than the film thickness at the mountain side 32 of the mountain MT2. Such a hydrogen plasma treatment adding a small amount of silicon-containing gas has a smaller rate of change in the film thickness than that of the hydrogen plasma treatment which only uses hydrogen (hydrogen plasma etching); therefore, the film thickness distribution can be more strictly controlled.

In the solar cell 10 of a back contact type thus formed, the backside 21B of the crystal substrate 11 corresponding to the amorphous silicon layer which was not etched due to the resist film (other part other than the part where the second texture surface is formed), i.e. the backside 21B of the crystal substrate 11 corresponding to the p-type semiconductor layer 15 and the i-type semiconductor layer 14 corresponding thereto, is the first texture surface having the mountains MT1 and the valleys VY1. The film thickness of the amorphous silicon layer at the summit 31 of the mountain MT1 on the backside 21B is smaller than the film thickness of the amorphous silicon layer at the mountain side 32 of the mountain MT1. More specifically, the film thickness of the i-type semiconductor layer 14 at the summit 31 of the mountain MT1 is smaller than the film thickness of the i-type semiconductor layer 14 at the mountain side 32 of the mountain MT1. Still more specifically, the ratio $d_2/d_1$ of the film thickness $d_2$ of the i-type semiconductor layer 14 at the summit 31 of the mountain MT1 to the film thickness $d_1$ of the i-type semiconductor layer 14 at the mountain side 32 of the mountain MT1 of the backside 21B is smaller than the ratio $D_2/D_1$ of the film thickness $D_2$ of the p-type semiconductor layer 15 at the summit 31 of the mountain MT1 to the film thickness $D_1$ of the p-type semiconductor layer 15 at the mountain side 32 of the mountain MT1 of the backside 21B.

When the sacrificial layer 41 is formed on the backside 21B of the crystal substrate 11 in the solar cell 10 of a double-side contact type shown in FIG. 10C, the sacrificial layer 41 may be formed so that the film thickness of the sacrificial layer 41 at the summit 31 of the mountain MT2 is smaller than the film thickness of the sacrificial layer 41 at the mountain side 32 of the mountain MT2. As a result, in the subsequent etching using a mixed solution of ozone dissolved in hydrofluoric acid or the like, in which the sacrificial layer 41 serves as a buffer layer [second texture surface forming step], the crystal substrate 11 is etched in the vicinity of the summit 31 having a smaller film thickness of the sacrificial layer 41, whereby the above-described second texture surface TX2 can be easily formed.

In this mixed solution, the value XY [weight %$^2$] obtained by multiplying the hydrofluoric acid concentration X [weight %] and the ozone concentration Y [weight %] may be between 0.005 and 0.285 inclusive in one or more embodiments of the present invention.

If the value XY falls below the lower limit value of the above-mentioned value range, since the hydrofluoric acid concentration X is excessively low, the reaction rate in etching becomes excessively slow, and the productivity deteriorates. In addition, since the etching does not proceed properly, the mountain MT2 having the slope face SF2 satisfying the above equation (1) does not occur, and the second texture surface TX2 is not formed.

On the other hand, if the value XY exceeds the upper limit value of the above-mentioned value range, since the hydrofluoric acid concentration X is excessively high, the etching proceeds drastically and excessively, the mountain MT2 having the slope face SF2 satisfying the above-mentioned equation (1) does not occur, and the second texture surface is not formed. In addition, a side reaction such as etching the protective film (resist film) occurs, causing unexpected structural changes.

The value XY [weight %$^2$] may be between 0.015 and 0.1 inclusive in some embodiments, and between 0.03 and 0.05 inclusive in another embodiment.

In the mixed solution, the hydrofluoric acid concentration X may be between 1.5% and 25% by weight inclusive in one or more embodiments of the present invention, between 5% and 25% by weight inclusive in another embodiment, between 7% and 25% by weight inclusive in yet another embodiment, and between 8% and 25% by weight inclusive in yet another embodiment.

The present invention is not limited to the embodiments described above, and various modifications can be made within the scope set out in the claims. In other words, the technical scope of the present invention also includes embodiments obtained by combining technical means appropriately modified within the scope set out in the claims.

EXAMPLES

Hereinafter, one or more embodiments of the present invention will be described in detail by Examples; however, the present invention is not limited to these Examples.

Example 1

As a single-crystal silicon substrate, an n-type single crystal silicon substrate having a thickness of 200 μm in the plane orientation of the plane of incidence (100) was used. The silicon substrate was immersed in a 2% by weight hydrofluoric acid (HF) aqueous solution for 3 minutes to remove the silicon oxide film from the surface, and then rinsed twice with ultrapure water.

Subsequently, the silicon substrate was immersed in a 5 weight %/15 weight % KOH/isopropyl alcohol aqueous solution held at 70° C. for 15 minutes. As a result, both the major surfaces of the silicon substrate were etched, and texture (uneven surface) was formed [first texture surface forming step]. Thereafter, the silicon substrate was rinsed twice with ultrapure water.

When the major surface of the silicon substrate was observed under an atomic force microscope (AFM; manufactured by Pacific Nanotechnology, Inc.), a pyramidal texture exposing the (111) plane was formed (first texture surface).

Next, such a silicon substrate having a first texture surface (first TX surface) on both sides was introduced into a CVD device. Then, a sacrificial layer of i-type amorphous silicon having a film thickness of 6 nm was formed on one major surface (major surface which will be the non-light reception side). The film-forming conditions for the i-type amorphous silicon film were as follows: the substrate temperature was 150° C., the pressure was 120 Pa, the $SiH_4/H_2$ flow rate ratio was 3/10, and the input power density was 0.011 W/cm$^2$.

The film thickness of the thin film was calculated from the film-forming rate obtained by measuring the film thickness of the thin film formed on the glass substrate under the same conditions by spectroscopic ellipsometry (trade name: M2000; manufactured by J. A. Woollam Corporation).

Next, an i-type semiconductor layer of i-type amorphous silicon having a film thickness of 6 nm was formed on the other major surface (major surface which will be the light reception side). The film-forming conditions for the i-type amorphous silicon film were as follows: the substrate temperature was 150° C., the pressure was 120 Pa, the $SiH_4/H_2$ flow rate ratio was 3/10, and the input power density was 0.011 W/cm$^2$.

Further, a p-type semiconductor layer of p-type amorphous silicon having a conductivity type opposite to the conductivity type of the n-type single crystal silicon substrate and having a film thickness of 7 nm was formed on the i-type amorphous silicon layer. The film-forming conditions for the p-type amorphous silicon were as follows: the substrate temperature was 150° C., the pressure was 60 Pa, the $SiH_4/B_2H_6$ flow rate ratio was 1/3, and the input power density was 0.01 W/cm$^2$. The $B_2H_6$ gas flow rate herein is a flow rate of a diluent gas diluted with $H_2$ to a $B_2H_6$ density of 5000 ppm.

Next, a resist film was formed as a protective film on the p-type semiconductor layer. The silicon substrate having the resist film on the outermost surface on one side and having the sacrificial layer on the outermost surface on the other side was immersed in a mixed solution (etching solution) of 1 weight % HF aqueous solution and 20 ppm ozone for 8 minutes.

This etching [second texture surface forming step] resulted in etching the sacrificial layer and the major surface immediately thereunder, and the first texture surface of the major surface changed to the second texture surface (second TX surface). On the other hand, the major surface covered with the resist film was not etched and remained the first texture surface. After this etching, the resist film was removed.

The silicon substrate before and after this etching was used to photograph a cross-section orthogonal to the major surface of the silicon substrate in a range of 10 mm under a scanning electron microscope (SEM), and the texture surface was measured by analyzing the images. In this case, the first imaginary straight line and the second imaginary straight line were determined by analyzing images of mountains at five locations of the second texture surface confirmed in the images, and a mean value obtained therefrom was set to θ[°].

Next, an i-type semiconductor layer of i-type amorphous silicon was formed on the major surface, on which the second texture surface was formed. The film thickness and the film-forming conditions were the same as those of the i-type semiconductor layer immediately below the p-type semiconductor layer.

Further, an n-type semiconductor layer of n-type amorphous silicon having a film thickness of 4 nm was formed on the i-type amorphous silicon layer. The film-forming conditions for the n-type amorphous silicon were as follows: the substrate temperature was 150° C., the pressure was 60 Pa, the $SiH_4/PH_3$ flow rate ratio was 1/2, and the input power density was 0.01 W/cm$^2$. The $PH_3$ gas flow rate herein is a flow rate of a diluent gas diluted with $H_2$ to a $PH_3$ density of 5000 ppm.

Next, a transparent electrode layer of indium tin oxide (ITO; refractive index of 1.9) having a film thickness of 100 nm was formed on both major surface sides of the silicon substrate. This film formation was performed as follows: indium oxide was used as a target, the substrate temperature was room temperature, the pressure was 0.2 Pa in an argon atmosphere, and the power density of 0.5 W/cm$^2$ was applied.

Next, a silver-electrode layer (planar electrode) having a film thickness of 500 nm was formed on the transparent electrode layer on the n-type semiconductor layer by way of a sputtering method. The transparent electrode layer on the p-type semiconductor layer was screen-printed with silver paste using a #230-mesh screen plate (opening width: 1=85 μm) having an opening width (80 μm) corresponding to the electrode pattern, and dried at 150° C. to form a linear electrode.

Thereafter, the silicon substrate was removed from the outer peripheral edge into a width of 0.5 mm by way of a laser beam machine, and was used as a heterojunction solar cell of a double-side contact type of Example 1.

Examples 2 to 9

The solar cells of Examples 2 to 9 were produced in the same manner as in Example 1 except that the ozone concentration and the hydrofluoric acid concentration were changed as shown in Table 1 below, in the etching using a mixed solution of ozone dissolved in hydrofluoric acid in Example 1 (hereinafter referred to as the second texture surface forming step).

Example 10

The solar cell of Example 10 was produced in the same manner as in Example 1 except that only 20% of the area of the major surface of the silicon substrate was the second texture surface, in the second texture surface forming step.

Comparative Example 1

The solar cell of Comparative Example 1 was produced in the same manner as in Example 1 except that a sacrificial layer was not formed and the second texture surface forming step was not performed. Namely, Comparative Example 1 is the solar cell having the first texture surface on both major surfaces of the silicon substrate.

Comparative Example 2

The solar cell of Comparative Example 2 was produced in the same manner as in Example 1 except that only 10% of the area of the major surface of the silicon substrate was the second texture surface, in the second texture surface forming step.

Comparative Example 3

The solar cell of Comparative Example 3 was produced in the same manner as in Example 1 except that the second texture surface was formed on both major surfaces of the silicon substrate without using a resist film, and thereafter, the i-type semiconductor layer was further formed on the major surface which will be the light reception side, and the p-type semiconductor layer was further formed on the layer, in the second texture surface forming step.

Comparative Examples 4 to 6

The solar cells of Comparative Examples 4 to 6 were produced in the same manner as in Example 1 except that the ozone concentration and the hydrofluoric acid concentration were changed as shown in Table 1 below, in the etching using the mixed solution of ozone dissolved in hydrofluoric acid as described above.

Comparative Example 7

The production was performed in the same manner as in Example 1 except that, instead of the etching using a mixed solution of ozone dissolved in hydrofluoric acid as described above, immersion was carried out for 1 minute using a solution, in which a 48 weight % HF aqueous solution and concentrated nitric acid were mixed at a ratio of 1:80.

Example 11

Example 11 is a heterojunction solar cell of a back contact type. In the same manner as in Example 1, texture was formed on both major surfaces of the silicon substrate [first texture surface forming step].

Next, the silicon substrate having the first texture surface on both sides was introduced into a CVD device. Then, an i-type semiconductor layer of i-type amorphous silicon having a film thickness of 5 nm was formed on the major surface which will be the light reception side. The film-forming conditions for the i-type amorphous silicon film were as follows: the substrate temperature was 150° C., the pressure was 120 Pa, the $SiH_4/H_2$ flow rate ratio was 3/10, and the input power density was 0.011 $W/cm^2$.

Further, an anti-reflective layer having a film thickness of 100 nm was formed on the i-type amorphous silicon layer. The film-forming conditions for the anti-reflective layer were as follows: the substrate temperature was 150° C., the pressure was 80 Pa, the $NH_3/SiH_4/H_2$ flow rate ratio was 1/1/40, and the input power density was 0.2 $W/cm^2$.

Then, an i-type semiconductor layer of i-type amorphous silicon having a film thickness of 6 nm was formed on the major surface which will be the non-light reception side. The film-forming conditions for the i-type amorphous silicon film were as follows: the substrate temperature was 150° C., the pressure was 120 Pa, the $SiH_4/H_2$ flow rate ratio was 3/10, and the input power density was 0.011 $W/cm^2$.

Further, an n-type semiconductor layer of n-type amorphous silicon having a film thickness of 7 nm was formed on the i-type amorphous silicon layer. The film-forming conditions for the p-type amorphous silicon were as follows: the substrate temperature was 150° C., the pressure was 60 Pa, the $SiH_4/B_2H_6$ flow rate ratio was 1/3, and the input power density was 0.01 $W/cm^2$.

Next, as a protective film, a resist film was formed on substantially the entire surface of the anti-reflective layer on the upside of the crystal substrate, and a resist film was pattern-printed on the p-type semiconductor layer. Then, the silicon substrate covered with the resist film (resist pattern) was immersed in a mixed solution (etching solution) of 1 weight % HF aqueous solution and 20 ppm ozone for 15 minutes.

This etching [second texture surface forming step] resulted in etching of the major surface of the p-type semiconductor layer, the i-type semiconductor layer and the non-light reception side which are uncovered with the resist film, and the first texture surface of the major surface changed to the second texture surface. On the other hand, the major surface of the light reception side was not etched due to the resist film and remained the first texture surface. The ratio of the opening area to the non-opening area in the resist pattern was 1:1. Therefore, the area ratio of the remaining p-type semiconductor layer to the n-type semiconductor layer described later is 1:1.

After removing the resist film, an i-type semiconductor layer of i-type amorphous silicon having a film thickness of 5 nm was formed on the p-type semiconductor layer and the major surface exposed. The film thickness and the film-forming conditions were the same as those for the i-type semiconductor layer immediately below the p-type semiconductor layer.

Subsequently, an n-type semiconductor layer of n-type amorphous silicon having a film thickness of 4 nm was formed on the i-type amorphous silicon layer. The film-forming conditions for the n-type amorphous silicon were as follows: the substrate temperature was 150° C., the pressure was 60 Pa, the $SiH_4/PH_3$ flow rate ratio was 1/2, and the input power density was 0.01 $W/cm^2$.

Further, as for the n-type semiconductor layer, part of the n-type semiconductor layer on the p-type semiconductor layer was patterned by, for example, etching using a resist film.

Then, a transparent electrode layer of indium tin oxide (ITO; refractive index of 1.9) having a film thickness of 100 nm was formed on the p-type semiconductor layer and the n-type semiconductor layer thus patterned, by way of a sputtering method using a mask so as to form a separation trench. This film formation was performed as follows: indium oxide was used as a target, the substrate temperature was room temperature, the pressure was 0.2 Pa in an argon atmosphere, and the power density of 0.5 $W/cm^2$ was applied.

The transparent electrode layer was screen-printed with silver paste using a #230-mesh screen plate (opening width: 1=85 μm) having an opening width (80 μm) corresponding to the electrode pattern, and dried at 150° C. to form a linear electrode.

Thereafter, the silicon substrate was removed from the outer peripheral edge into a width of 0.5 mm by way of a laser beam machine, and was used as a heterojunction solar cell of a back contact type of Example 12.

Comparative Example 8

The production was performed in the same manner as in Example 11 except that, instead of the etching using a mixed solution of ozone dissolved in hydrofluoric acid as described above, immersion was carried out for 1 minute using a solution, in which a 48 weight % HF aqueous solution and concentrated nitric acid were mixed at a ratio of 1:80.

Example 12

The solar cell of Example 12 was produced in the same manner as in Example 11 except that a hydrogen plasma treatment using hydrogen $H_2$ and silicon-containing gas $SiH_4$ was performed on the major surface, which will be the non-light reception side, after forming the i-type semiconductor layer and before forming the p-type semiconductor layer in Example 11. As a result, distribution occurs in the film thickness of the amorphous silicon layer composed of the i-type semiconductor layer and the p-type semiconductor layer. In the subsequent etching using a mixed solution of ozone dissolved in hydrofluoric acid or the like, in which the amorphous silicon layer serves as a buffer layer [second texture surface forming step], the crystal substrate 11 was etched in the vicinity of the summits 31 having a smaller film thickness of the amorphous silicon layer. The second texture surface TX2 described above was thus formed.

Comparative Example 9

The production was performed in the same manner as in Example 12 except that, instead of the etching using a mixed solution of ozone dissolved in hydrofluoric acid as described above, immersion was carried out for 1 minute using a solution, in which a 48 weight % HF aqueous solution and concentrated nitric acid were mixed at a ratio of 1:80.

<Evaluation>

Table 1 shows a measurement result such as conditions for manufacturing a heterojunction solar cell (hydrofluoric acid concentration [X], ozone concentration [Y], hydrofluoric acid concentration×ozone concentration [XY]) and the minimum angle θ[°] as well as solar cell characteristics (open-circuit voltage (Voc), short-circuit current density (Isc), fill factor (FF), conversion efficiency (Eff)) in the Examples and Comparative Examples described above. In Table 1, the solar cell characteristics (Voc, Isc, FF, Eff) of Examples 1 to 10 and Comparative Examples 2 to 7 are relative values in relation to the solar cell characteristics (Voc, Isc, FF, Eff) of Comparative Example 1. The solar cell characteristics (Voc, Isc, FF, Eff) of Example 11 are relative values in relation to the solar cell characteristics (Voc, Isc, FF, Eff) of Comparative Example 8. The solar cell characteristics (Voc, Isc, FF, Eff) of Example 12 are relative values in relation to the solar cell characteristics (Voc, Isc, FF, Eff) of Comparative Example 9. In Table 1, the solar cell characteristics (Voc, Isc, FF, Eff) of Comparative Example 8 are indicated as being identical to the solar cell characteristics (Voc, Isc, FF, Eff) of Comparative Example 9 due to the number of significant digits after decimal point; however, in reality, the solar cell characteristics (Voc, Isc, FF, Eff) of Comparative Example 9 have higher outputs.

TABLE 1

| | HYDROFLUORIC ACID CONCENTRATION X [WEIGHT %] | OZONE CONCENTRATION Y [WEIGHT %] | OZONE CONCENTRATION × HYDROFLUORIC ACID CONCENTRATION XY [WEIGHT %]$^2$ | LIGHT RECEPTION SIDE (UPSIDE) | NON-LIGHT RECEPTION SIDE (BACKSIDE) | θ[°] | AREA TREATED [%] | Voc [V] | Isc [A] | FF | Eff [%] |
|---|---|---|---|---|---|---|---|---|---|---|---|
| EXAMPLE 1 | 8 | 0.002 | 0.016 | 1ST TX SURFACE | 2ND TX SURFACE | 2.0 | 100 | 1.01 | 1.02 | 1.01 | 1.028 |
| EXAMPLE 2 | 8 | 0.004 | 0.032 | | | 2.3 | 100 | 1.01 | 1.02 | 1.01 | 1.041 |
| EXAMPLE 3 | 8 | 0.012 | 0.096 | | | 2.7 | 100 | 1.01 | 1.01 | 1.01 | 1.033 |
| EXAMPLE 4 | 16 | 0.002 | 0.032 | | | 2.5 | 100 | 1.01 | 1.02 | 1.01 | 1.035 |
| EXAMPLE 5 | 16 | 0.004 | 0.064 | | | 2.8 | 100 | 1.01 | 1.01 | 1.01 | 1.032 |
| EXAMPLE 6 | 16 | 0.012 | 0.192 | | | 7.0 | 100 | 1.01 | 1.00 | 1.00 | 1.015 |
| EXAMPLE 7 | 24 | 0.002 | 0.048 | | | 2.6 | 100 | 1.01 | 1.02 | 1.01 | 1.035 |
| EXAMPLE 8 | 24 | 0.004 | 0.096 | | | 5.1 | 100 | 1.01 | 1.01 | 1.01 | 1.026 |
| EXAMPLE 9 | 2 | 0.004 | 0.008 | | | 1.6 | 100 | 1.00 | 1.01 | 1.00 | 1.017 |
| EXAMPLE 10 | 8 | 0.002 | 0.016 | | | 2.0 | 20 | 1.00 | 1.01 | 1.00 | 1.014 |
| COMPARATIVE EXAMPLE 1 | — | — | — | 1ST TX SURFACE | 1ST TX SURFACE | — | | 1.00 | 1.00 | 1.00 | 1.000 |
| COMPARATIVE EXAMPLE 2 | 8 | 0.002 | 0.016 | | 2ND TX SURFACE | 2.0 | 10 | 1.00 | 0.99 | 1.00 | 0.995 |
| COMPARATIVE EXAMPLE 3 | 8 | 0.002 | 0.016 | 2ND TX SURFACE 2.0° | | 2.0 | 100 (BOTH MAJOR SURFACES) | 1.01 | 0.97 | 1.01 | 0.989 |
| COMPARATIVE EXAMPLE 4 | 1 | 0.002 | 0.002 | 1ST TX SURFACE | | 0.8 | 100 | 1.00 | 1.00 | 1.00 | 1.000 |
| COMPARATIVE EXAMPLE 5 | 24 | 0.012 | 0.288 | | | 9.0 | 100 | 1.01 | 0.99 | 1.00 | 0.997 |
| COMPARATIVE EXAMPLE 6 | 1 | 0.004 | 0.004 | | | 1.1 | 100 | 1.00 | 1.00 | 1.00 | 1.000 |
| COMPARATIVE EXAMPLE 7 | 1 | NITRIC ACID USED | — | | 1ST TX SURFACE | | 100 | 1.01 | 0.99 | 1.00 | 0.998 |
| EXAMPLE 11 | 8 | 0.002 | 0.016 | 1ST TX SURFACE | 2ND TX SURFACE | 2.0 | 50 | 1.01 | 1.01 | 1.01 | 1.033 |
| COMPARATIVE EXAMPLE 8 | 1 | NITRIC ACID USED | — | 1ST TX SURFACE | 1ST TX SURFACE | | 50 | 1.00 | 1.00 | 1.00 | 1.000 |
| EXAMPLE 12 | 8 | 0.004 | 0.032 | 1ST TX SURFACE | 2ND TX SURFACE | 2.3 | 50 | 1.01 | 1.02 | 1.01 | 1.041 |
| COMPARATIVE EXAMPLE 9 | 1 | NITRIC ACID USED | — | 1ST TX SURFACE | 1ST TX SURFACE | | 50 | 1.00 | 1.00 | 1.00 | 1.000 |

From comparison between Examples 1 to 9 and Comparative Example 1 or Comparative Example 7, the conversion efficiency (Eff) was improved, when the first texture surface was formed on the major surface of the light reception side, and the second texture surface was formed on the major surface of the non-light reception side in the silicon substrate. This is considered to be because the optical confinement effect caused by the second texture surface on the non-light reception side was enhanced, improving the short-circuit current (Isc).

Figure 12:
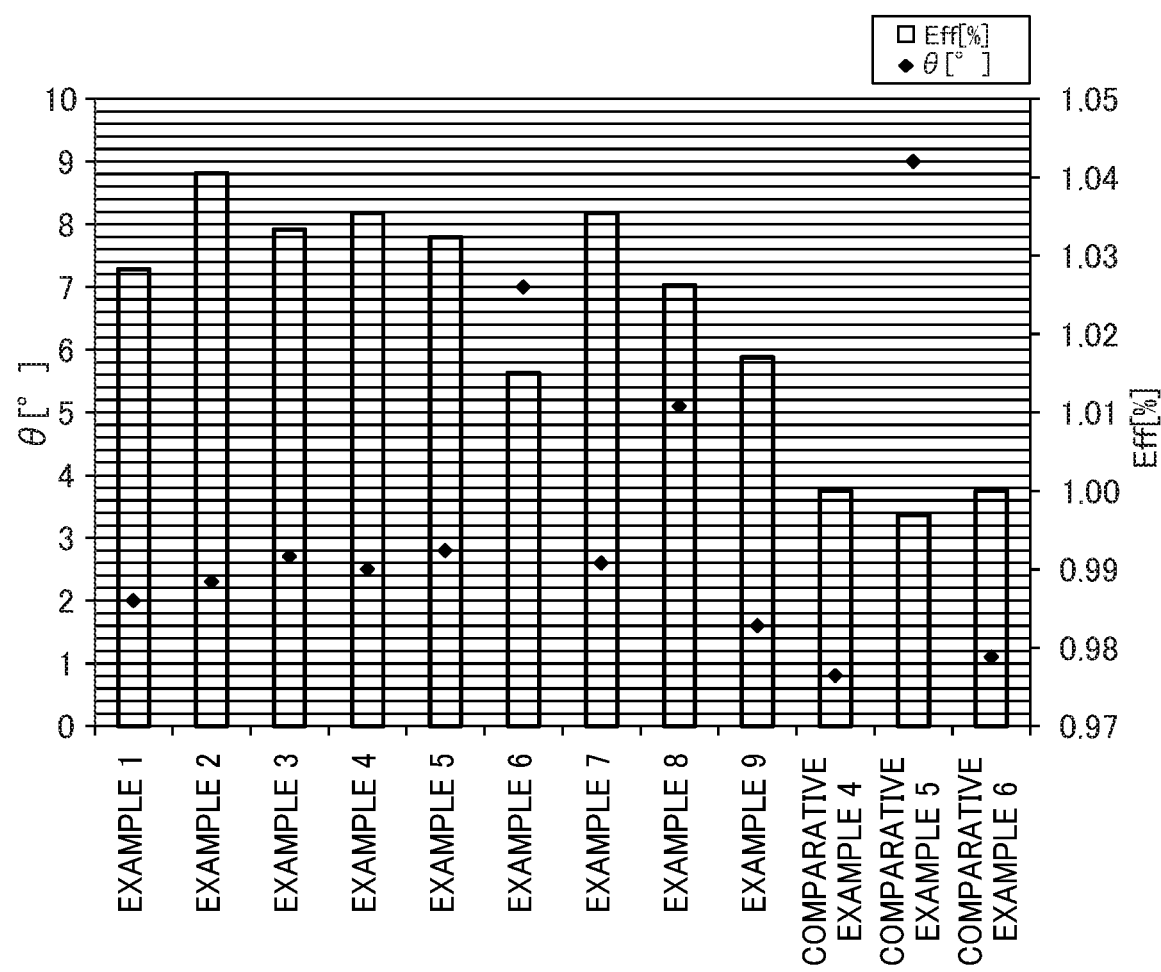
FIG. 12 is a graph of a minimum angle θ[°] and a conversion efficiency [%] in Examples 1 to 9 and Comparative Examples 4 to 6.

As shown in FIG. 12, from the graph of the minimum angle θ and the conversion efficiency in Examples 1 to 9 and Comparative Examples 4 to 6, it was found that the minimum angle θ[°] is preferably 1.5≤θ≤8, more preferably 2≤θ≤5.5, and still more preferably 2.3≤θ≤2.6.

Figure 13:
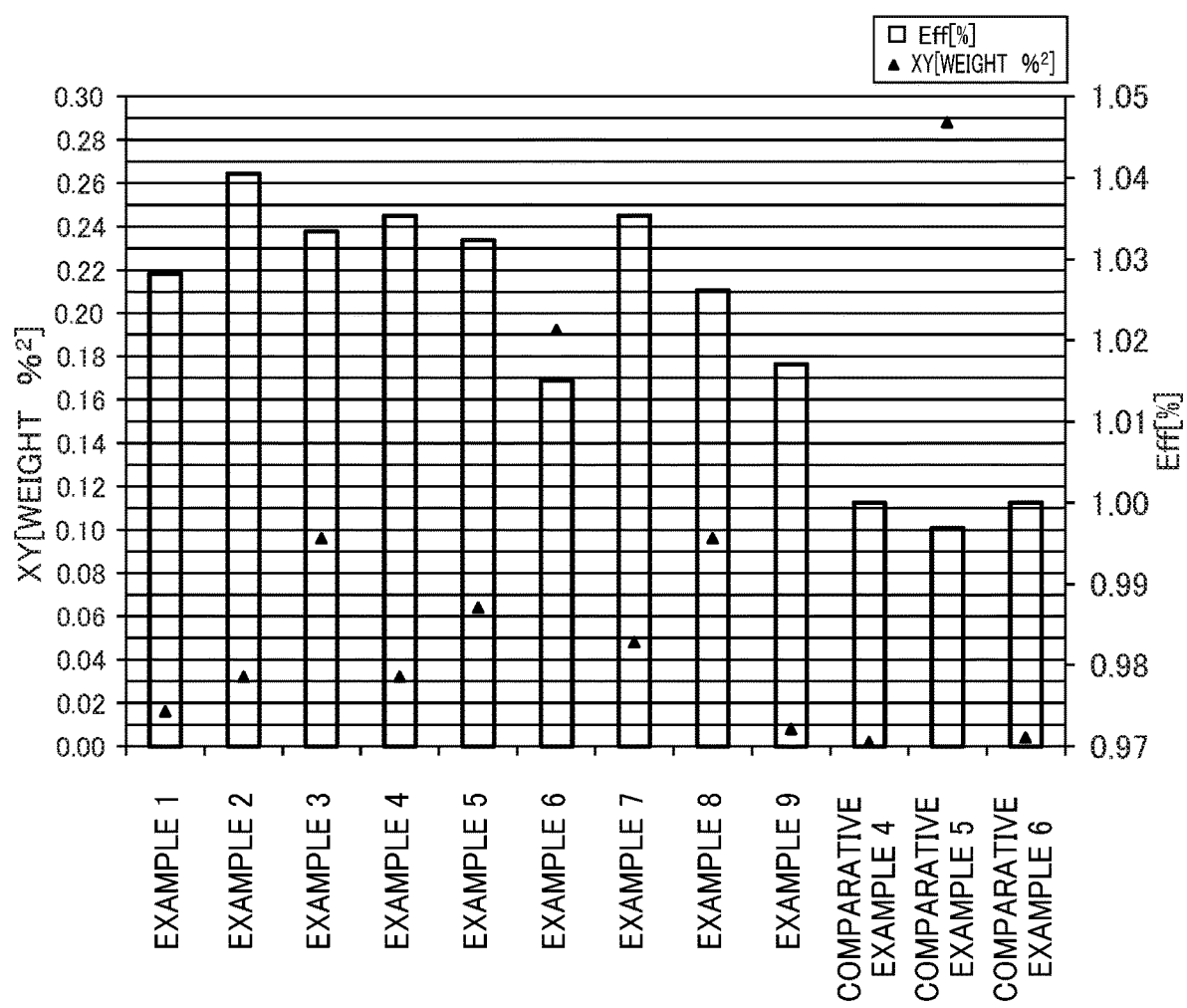
FIG. 13 is a graph of a value XY [weight %$^2$] obtained by multiplying a hydrofluoric acid concentration X [weight %] and an ozone concentration Y [weight %], as well as a conversion efficiency [%], in Examples 1 to 9 and Comparative Examples 4 to 6.

Further, as shown in FIG. 13, from the graph of the value XY [weight %$^2$] obtained by multiplying the hydrofluoric acid concentration X [weight %] and the ozone concentration Y [weight %], as well as the conversion efficiency, in Examples 1 to 9 and Comparative Examples 4 to 6, it was found that the value XY is preferably between 0.005 and 0.285 inclusive, more preferably between 0.015 and 0.1 inclusive, and still more preferably between 0.03 and 0.05 inclusive.

In Example 1 to 8, the open-circuit voltage Voc was also improved as compared with Comparative Example 1. This is considered to be because the defects in the amorphous silicon layer formed on the second texture surface were reduced.

The conversion efficiency was not sufficiently improved in Comparative Example 2, in which the second texture surface was only formed in 10% of the area of the major surface of the non-light reception side. However, as compared with Comparative Example 2, the conversion efficiency was sufficiently improved in Example 10, in which the second texture surface was formed in 20% of the area of the major surface of the non-light reception side, or in Example 1 to 9, in which the entirety (100%) of the major surface of the non-light reception side was the second texture surface. This revealed that, when the second texture surface occupies 20% or more of the area of the major surface of the non-light reception side, a satisfactory optical confinement effect and a defect-reduction effect can be achieved.

Further, from comparison between Example 1 and Comparative Example 3, which share the same minimum angle θ[°], the short-circuit current in Comparative Example 3 was lower than that in Example 1. This is considered to be because, when the second texture surface was formed not only on the non-light reception side but also on the major surface of the light reception side, the reflectance increasing effect caused by the major surface of the light reception side exceeded the optical confinement effect caused by the major surface of the non-light reception side.

In addition, from comparison between Example 11 and Comparative Example 8, as well as comparison between Example 12 and Comparative Example 9, which are solar cells of a back contact type, it was found that the conversion efficiency was improved when the non-light reception side had the second texture surface, and the light reception side had the first texture surface in the crystal substrate. That is, regardless of a double-side contact type or a back contact type, the conversion efficiency can be enhanced when the solar cell includes a crystal substrate having the second texture surface on the non-light reception side and the first texture surface on the light reception side.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATION OF REFERENCE NUMERALS

10: solar cell
11: crystal substrate
14: i-type semiconductor layer [amorphous silicon layer]
15: p-type semiconductor layer [second conductivity type semiconductor layer, amorphous silicon layer]
16: n-type semiconductor layer [first conductivity type semiconductor layer]
17: transparent electrode layer
18: metal electrode layer
21: major surface of crystal substrate
21U: major surface of upside [frontside major surface]
21B: major surface of backside [backside major surface]
TX1: first texture surface
TX2: second texture surface
MT: mountain included in uneven surface
MT1: mountain on first texture surface [first mountain]
MT2: mountain on second texture surface [second mountain]
VY: valley included in uneven surface
VY1: valley on first texture surface [first valley]
VY2: valley on second texture surface [second valley]
31: summit
32: mountain side
33: mountain foot
SF: slope face of mountain
SF1: slope face of mountain on first texture surface
SF2: slope face of mountain on second texture surface
SF231: one part of slope face of mountain on second texture surface (slope face part on summit side)
SF233: other part of slope face of mountain on second texture surface (slope face part on mountain foot side)
BL: broken line [inflection point]
41: sacrificial layer [amorphous silicon layer]
US: upside (frontside) of solar cell (light reception side)
BS: backside of solar cell (non-light reception side)
L1: first imaginary straight line
L2: second imaginary straight line
θ: minimum angle formed by first imaginary straight line and second imaginary straight line

What is claimed is:
1. A solar cell comprising a crystal substrate, wherein the crystal substrate comprises:
a frontside major surface that receives light; and
a backside major surface opposite to the frontside major surface,
wherein at least part of the frontside major surface is an uneven surface comprising a plurality of first mountains and a plurality of first valleys,
wherein each of the first mountains has a first pointed summit, a first mountain foot, and a first slope face that is a smooth surface connected to the first mountain foot and the first pointed summit,
wherein at least part of the backside major surface is an uneven surface comprising a plurality of second mountains and a plurality of second valleys, wherein each of the second mountains has a second pointed summit, a second mountain foot, and a second slope face comprising an inflection point at a mountain side, wherein an angle of inclination from the second mountain foot to the mountain side of each of the second mountains differs from an angle of inclination from the mountain side to the second pointed summit of each of the second mountains, wherein in a cross-section passing through the second pointed summit of each of the second mountains and being perpendicular to the second mountain foot of each of the second mountains, an angle θ[°] formed by a first imaginary straight line from the second mountain foot to the second pointed summit of each of the second mountains and a second imaginary straight line from the second mountain foot to the inflection point at the mountain side of each of the second mountains is 1.5≤θ≤8, and wherein the plurality of the second mountains occupy 20% or more of an area of the backside major surface.

2. The solar cell according to claim 1, wherein the angle θ[°] formed by the first imaginary straight line from the second mountain foot to the second pointed summit of each of the second mountains and the second imaginary straight line from the second mountain foot to the inflection point at the mountain side of each of the second mountains is 2≤θ≤5.5.

3. The solar cell according to claim 2, wherein the angle θ[°] formed by the first imaginary straight line from the second mountain foot to the second pointed summit of each of the second mountains and the second imaginary straight line from the second mountain foot to the inflection point at the mountain side of each of the second mountains is 2.3≤θ≤2.6.

4. The solar cell according to claim 1, further comprising an amorphous silicon layer laminated on the backside major surface of the crystal substrate, wherein the backside major surface of the crystal substrate, other than the at least part of the backside major surface that is the uneven surface comprising the plurality of the second mountains and the plurality of the second valleys, is an uneven surface comprising a plurality of the first mountains and a plurality of the first valleys, and wherein a film thickness of the amorphous silicon layer laminated on the first pointed summits of the plurality of the first mountains of the backside major surface is smaller than a film thickness of the amorphous silicon layer laminated on the mountain sides of the plurality of the first mountains of the backside major surface.

5. The solar cell according to claim 4, wherein the amorphous silicon layer includes an intrinsic silicon layer and a conductivity type silicon layer sequentially laminated on the backside major surface of the crystal substrate, and wherein a film thickness of the intrinsic silicon layer laminated on the first pointed summits of the plurality of the first mountains of the backside major surface is smaller than a film thickness of the intrinsic silicon layer laminated on the mountain sides of the plurality of the first mountains of the backside major surface.

6. The solar cell according to claim 4, wherein a ratio d2/d1 of a film thickness d2 of an intrinsic silicon layer laminated on the first pointed summits of the plurality of the first mountains of the backside major surface to a film thickness d1 of an intrinsic silicon layer laminated on the mountain sides of the plurality of the first mountains of the backside major surface is smaller than a ratio D2/D1 of a film thickness D2 of a conductivity type silicon layer laminated on the first pointed summits of the plurality of the first mountains of the backside major surface to a film thickness D1 of a conductivity type silicon layer laminated on the mountain sides of the plurality of the first mountains of the backside major surface.

7. The solar cell according to claim 1, wherein the solar cell is of a back contact type, and wherein a first conductivity type semiconductor layer and a second conductivity type semiconductor layer are formed on a side of the backside major surface.

8. A solar cell module comprising a plurality of the solar cells according to claim 1.

9. The solar cell according to claim 1, wherein the solar cell is of a double-side contact type, and wherein a first conductivity type semiconductor layer is formed on a side of the backside major surface, and a second conductivity type semiconductor layer is formed on a side of the frontside major surface.

* * * * *